US011482350B2

(12) United States Patent
Bae et al.

(10) Patent No.: US 11,482,350 B2
(45) Date of Patent: Oct. 25, 2022

(54) FLEXIBLE FLAT CABLE AND METHOD OF PRODUCING THE SAME

(71) Applicant: SAMSUNG ELECTRONICS CO., LTD., Suwon-si (KR)

(72) Inventors: Bumhee Bae, Suwon-si (KR); Youngkun Kwon, Suwon-si (KR); Minseok Kim, Suwon-si (KR); Younho Kim, Suwon-si (KR); Changwon Jang, Suwon-si (KR); Jeongnam Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 16/749,419

(22) Filed: Jan. 22, 2020

(65) Prior Publication Data

US 2020/0265971 A1    Aug. 20, 2020

(30) Foreign Application Priority Data

Feb. 19, 2019    (KR) ........................ 10-2019-0019097

(51) Int. Cl.
*H01B 7/08*    (2006.01)
*H05K 1/02*    (2006.01)
(Continued)

(52) U.S. Cl.
CPC ........... *H01B 7/08* (2013.01); *H01B 13/0036* (2013.01); *H05K 1/0218* (2013.01); *H05K 1/148* (2013.01);
(Continued)

(58) Field of Classification Search
CPC .... H01B 7/08; H01B 13/0036; H05K 1/0218; H05K 1/148; H05K 2201/058; H05K 2201/0715
See application file for complete search history.

(56) References Cited

U.S. PATENT DOCUMENTS 3,576,723 A * 4/1971 Angele ................ H01B 7/0838
205/187
3,612,743 A * 10/1971 Angele ................ H01B 7/0838
174/36
(Continued)

FOREIGN PATENT DOCUMENTS

JP    06-021119    3/1994
JP    4066725    3/2008
(Continued)

OTHER PUBLICATIONS

International Search Report dated Apr. 29, 2020 in counterpart International Patent Application No. PCT/KR2020/001035.
(Continued)

*Primary Examiner* — William H. Mayo, III
*Assistant Examiner* — Rhadames Alonzo Miller
(74) *Attorney, Agent, or Firm* — Nixon & Vanderhye P.C.

(57)    ABSTRACT

Provided are a flexible flat cable and a method of producing the same. The flexible flat cable includes a plate-shaped first insulation portion comprising an insulating material; a first ground, a second ground, and a third ground disposed at predetermined intervals on the first insulation portion; at least one first signal transmission line positioned between the first ground and the second ground and disposed on the first insulation portion; at least one second signal transmission line positioned between the second ground and the third ground and disposed on the first insulation portion; a first second insulation portion disposed on at least a portion of the first ground and at least a portion of the at least one first signal transmission line and the second ground; a second insulation portion disposed on at least a portion of the second ground and at least a portion of the at least one second signal transmission line, and the third ground; a conductive adhesive layer configured to enclose the first insulation portion, the first second insulation portion, and the
(Continued)

second insulation portion; and a shielding portion comprising a shielding material adhered to an outside of the conductive adhesive layer. Therefore, by improving shielding efficiency of a plurality of signal transmission lines, while having good electromagnetic interference and crosstalk characteristics, a plurality of signals can be simultaneously transmitted.

18 Claims, 26 Drawing Sheets

(51) Int. Cl.
  *H05K 1/14* (2006.01)
  *H01B 13/00* (2006.01)
(52) U.S. Cl.
  CPC .............. *H05K 2201/058* (2013.01); *H05K 2201/0715* (2013.01)

(56) References Cited

U.S. PATENT DOCUMENTS

| | | | | |
|---|---|---|---|---|
| 4,209,215 A * | 6/1980 | Verma | H01B 7/0838 | 439/497 |
| 4,283,593 A * | 8/1981 | Piasecki | H01B 7/08 | 174/112 |
| 4,596,897 A * | 6/1986 | Gruhn | H01B 11/1091 | 174/36 |
| 4,616,102 A * | 10/1986 | Noorily | H01B 7/0838 | 174/117 FF |
| 4,678,864 A * | 7/1987 | Cox | H01B 7/0823 | 156/289 |
| 5,003,126 A * | 3/1991 | Fujii | H01B 7/0861 | 174/36 |
| 5,250,127 A * | 10/1993 | Hara | H01B 7/385 | 156/247 |
| 5,342,991 A * | 8/1994 | Xu | H01B 7/0823 | 174/115 |
| 5,446,239 A * | 8/1995 | Mizutani | H01B 7/0838 | 174/117 F |
| 5,455,383 A * | 10/1995 | Tanaka | H01B 7/0861 | 174/117 A |
| 6,495,764 B1 * | 12/2002 | Hori | H01B 7/0861 | 174/117 F |
| 2009/0126972 A1 * | 5/2009 | Matsushita | H01B 7/0861 | 174/113 R |
| 2010/0096167 A1 | 4/2010 | Choi et al. | | |
| 2012/0103657 A1 | 5/2012 | Fuse | | |
| 2016/0329130 A1 * | 11/2016 | Evans | H01P 3/081 | |
| 2018/0053981 A1 * | 2/2018 | Bae | H01P 11/003 | |
| 2019/0008033 A1 * | 1/2019 | Chung | H05K 3/422 | |

FOREIGN PATENT DOCUMENTS

| | | |
|---|---|---|
| JP | 2017-152562 A | 8/2017 |
| KR | 10-0770832 | 10/2007 |
| KR | 10-0880182 | 1/2009 |
| KR | 10-1160589 | 6/2012 |
| KR | 10-2015-0083018 | 7/2015 |
| KR | 10-2018-0019472 | 2/2018 |
| WO | 2016/179606 | 11/2016 |

OTHER PUBLICATIONS

Extended European Search Report dated Nov. 17, 2021 for EP Application No. 20760300.2.

* cited by examiner

FLEXIBLE FLAT CABLE AND METHOD OF PRODUCING THE SAME

CROSS-REFERENCE TO RELATED APPLICATION

This application is based on and claims priority under 35 U.S.C. § 119 to Korean Patent Application No. 10-2019-0019097, filed on Feb. 19, 2019, in the Korean Intellectual Property Office, the disclosure of which is incorporated by reference herein in its entirety.

BACKGROUND

Field

The disclosure relates to a flexible flat cable and a method of producing the same.

Description of Related Art

Electronic devices such as smart phones, tablet personal computers (PCs), and computers are becoming smaller, slimmer, and more versatile.

An electronic device may use various electronic components such as a processor, memory, speaker, microphone, sensor, camera, antenna, or communication module by mounting in or connecting to a printed circuit board (PCB) or a flexible printed circuit board (FPCB).

The PCB or FPCB may include a cable for connecting the above-described electronic components to each other.

Cables used in electronic devices are becoming thinner, and the need for shielding against electromagnetic interference (EMI) is increasing.

When the electronic device simultaneously uses a low speed signal and a high speed signal, electromagnetic interference and crosstalk characteristics may deteriorate.

In order to shield a signal, a coaxial cable may be used. Because the coaxial cable is expensive, a use area thereof may be limited.

In order to shield a signal, an FPCB using an impedance matching film may be used. Because the FPCB using the impedance matching film does not completely enclose a signal transmission line, shielding efficiency may be low, and electromagnetic interference and crosstalk characteristics may not be good.

In order to shield a signal, a cable for charging a conductor by forming a via in the PCB may be used. The cable charged with a conductor in the via may not completely shield a signal transmission line because of a distance between vias.

In order to improve electromagnetic interference and crosstalk characteristics, it is necessary to increase shielding efficiency against electromagnetic interference generated in the cable.

SUMMARY

Embodiments of the disclosure provide a flexible flat cable and a method of producing the same that can increase shielding efficiency at a low cost compared with existing cables and simultaneously transmit a plurality of signals.

According to various example embodiments of the disclosure, a flexible flat cable includes a plate-shaped first insulation portion comprising an insulating material; a first ground portion, a second ground portion, and a third ground portion disposed at predetermined intervals on the first insulation portion; at least one first signal transmission line positioned between the first ground portion and the second ground portion and disposed on the first insulation portion; at least one second signal transmission line positioned between the second ground portion and the third ground portion and disposed on the first insulation portion; a first second insulation portion disposed on at least a portion of the first ground portion and at least a portion of the at least one first signal transmission line and the second ground portion; a second insulation portion disposed on at least a portion of the second ground portion and at least a portion of the at least one second signal transmission line and the third ground portion; a conductive adhesive layer enclosing the first insulation portion, the first second insulation portion, and the second insulation portion; and a shielding portion adhered to the outside of the conductive adhesive layer.

According to various example embodiments of the disclosure, a flexible flat cable includes a plate-shaped first insulation portion comprising an insulating material; a first ground portion, a second ground portion, and a third ground portion disposed at predetermined intervals on the first insulation portion; a first power line and a first signal transmission line positioned between the first ground portion and the second ground portion and disposed on the first insulation portion; a second signal transmission line positioned between the second ground portion and the third ground portion and disposed on the first insulation portion; a first second insulating portion disposed on at least a portion of the first ground portion and at least a portion of the first power line and the second ground portion; a second insulation portion disposed on at least a portion of the second ground portion and at least a portion of the second signal transmission line and the third ground portion; a conductive adhesive layer enclosing a portion of the first ground portion, the first second insulation portion, a portion of the second ground portion, and a portion of the first second insulation portion and the third ground portion; a shielding portion adhered to the outside of the conductive adhesive layer; a bonding sheet disposed on a lower surface of the first insulating portion; a first mesh copper layer disposed at the lower surface of the bonding sheet; a non-conductive adhesive layer enclosing side surfaces of the first ground portion and the third ground portion, a side surface of the first insulation portion, and first mesh copper layer; and a third insulating portion adhered to the outside of the non-conductive adhesive layer.

According to various example embodiments of the disclosure, a method of producing a flexible flat cable includes disposing a copper thin film layer on a plate-shaped first insulating portion; etching at least a portion of the copper thin film layer to form a first ground portion, a signal transmission line, and a second ground portion; punching a portion corresponding to the first ground portion and the second ground portion, and stacking a second insulation portion to enclose the signal transmission line; stacking and pressing a first conductive adhesive layer adhered to a lower surface of a first shielding portion on both side ends of the first insulation portion, the first ground portion, the second insulation portion, and the second ground portion; and stacking and pressing a second conductive adhesive layer adhered to an upper surface of a second shielding portion beneath the first insulating portion to connect both side ends of the second conductive adhesive layer to both side ends of the first conductive adhesive layer.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

The following description is made with reference to the accompanying drawings and is provided to assist in a comprehensive understanding of various example embodiments of the present disclosure. It includes various specific details to assist in that understanding but these are to be regarded as merely examples. Accordingly, those of ordinary skill in the art will recognize that various changes and modifications of the various example embodiments described herein can be made without departing from the scope of the present disclosure. In addition, descriptions of well-known functions and constructions may be omitted for clarity and conciseness.

The terms and words used in the following description and claims are not limited to the bibliographical meanings, but, are simply used to enable a clear and consistent understanding of the present disclosure. Accordingly, it should be apparent to those skilled in the art that the following description of various example embodiments of the present disclosure is provided for illustration purpose only and not for the purpose of limiting the present disclosure.

It is to be understood that the singular forms "a," "an," and "the" include plural referents unless the context clearly dictates otherwise. Thus, for example, reference to "a component surface" includes reference to one or more of such surfaces.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may be used to refer to various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present disclosure, and similarly, a second element may be referred to as a first element.

Figure 1:
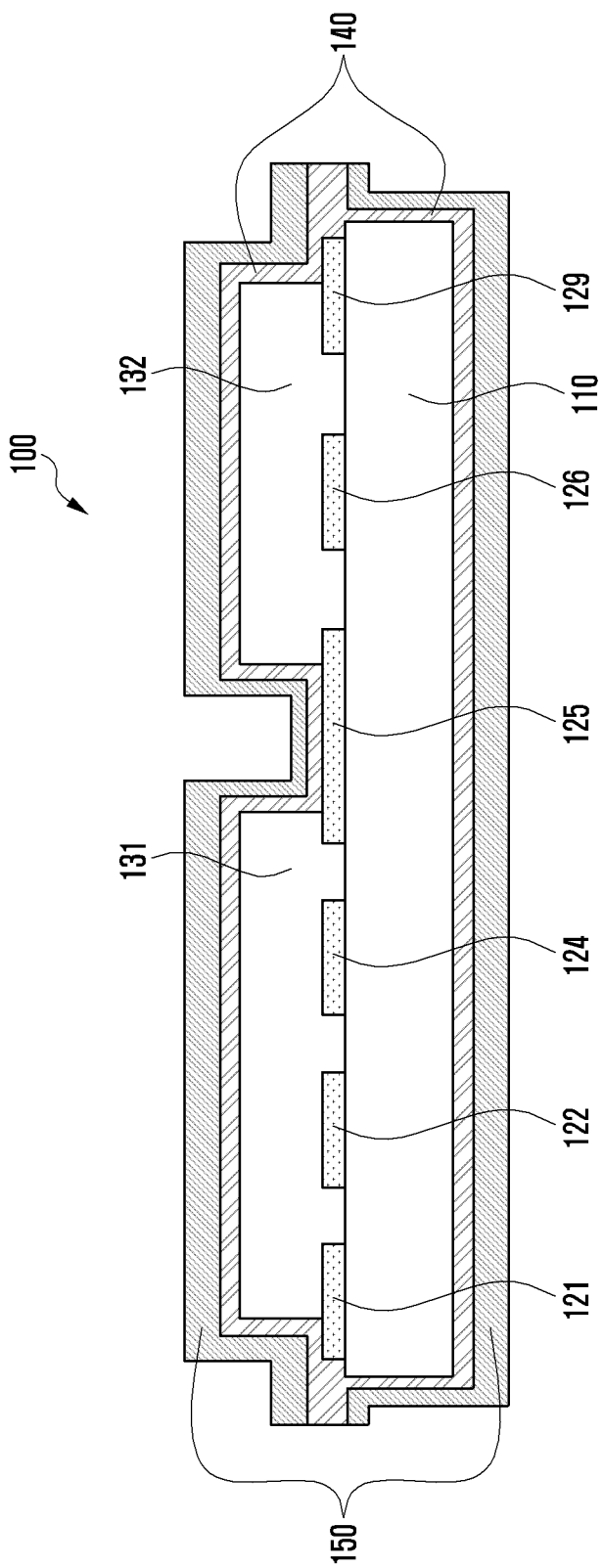
FIG. 1 is a cross-sectional view illustrating an example configuration of a flexible flat cable according to an example embodiment of the disclosure.

FIG. 1 is a cross-sectional view illustrating an example configuration of a flexible flat cable according to an example embodiment of the disclosure.

With reference to FIG. 1, a flexible flat cable 100 according to an example embodiment of the disclosure may include a first insulation portion (e.g., including an insulating material) 110, first ground portion 121, second ground portion 125, third ground portion 129, first (1-1) signal transmission line 122, second first (1-2) signal transmission line 124, second signal transmission line 126, first second (2-1) insulation portion 131, second (2-2) insulation portion 132, conductive adhesive layer 140, and shielding portion 150.

According to an example embodiment, the first insulating portion 110 may include a material having an insulating property. The first insulation portion 110 may, for example, be made of a dielectric material. The first insulation portion 110 may include, for example, a copper clad laminate (CCL).

According to an example embodiment, the first ground portion 121, the second ground portion 125, and the third ground portion 129 may be disposed at predetermined intervals on the first insulation portion 110. The first ground portion 121, the second ground portion 125, and the third ground portion 129 may be made, for example, of a conductive metal (e.g., copper) in which a current may flow.

According to an example embodiment, the 1-1 signal transmission line 122, the 1-2 signal transmission line 124, and the second signal transmission line 126 may be disposed at predetermined intervals on the first insulation portion 110. The 1-1 signal transmission line 122, the 1-2 signal transmission line 124, and the second signal transmission line 126 may be made, for example, of a conductive metal (e.g., copper) in which a current may flow. The 1-1 signal transmission line 122, the 1-2 signal transmission line 124, and the second signal transmission line 126 may include, for example, strip lines in which communication signals may be transmitted and received.

According to various embodiments, the 1-1 signal transmission line 122 and the 1-2 signal transmission line 124 may be disposed between the first ground portion 121 and the second ground portion 125. The second signal transmission line 126 may be disposed between the second ground portion 125 and the third ground portion 129. The 1-1 signal transmission line 122 and the 1-2 signal transmission line 124 may, for example, be used for transmission of a low speed signal. For example, the low speed signal may include, for example, and without limitation, at least one of an audio signal, a power signal, a control signal, or the like. The second signal transmission line 126 may be used for transmission of, for example, a high speed signal. For example, the high speed signal may include, for example, and without limitation, at least one of a 5G communication signal, a Wi-Fi signal, an intermediate frequency (IF) signal, or the like.

According to various embodiments, the 1-1 signal transmission line 122 and the 1-2 signal transmission line 124 may transmit differential signals having different phases. The 1-1 signal transmission line 122 and the 1-2 signal transmission line 124 may reduce an influence of interference or noise between signals.

According to various embodiments, the first ground portion 121, the second ground portion 125, the third ground portion 129, the 1-1 signal transmission line 122, the 1-2 signal transmission line 124, and the second signal transmission line 126 may be formed by stacking a copper thin film layer on the first insulation portion 110 and etching at least a portion of the copper thin film layer. At least one power line (not illustrated) may be disposed between the first ground portion 121 and the second ground portion 125. At least one power line (not illustrated) may be disposed between the second ground portion 125 and the third ground portion 129.

According to an embodiment, the 2-1 insulation portion 131 and the 2-2 insulation portion 132 may be made of a material having an insulating property. The 2-1 insulation portion 131 and the 2-2 insulation portion 132 may be made of a dielectric material. The 2-1 insulation portion 131 and the 2-2 insulation portion 132 may include a cover layer.

According to various embodiments, the 2-1 insulation portion 131 may be stacked on at least a portion of the first ground portion 121 and at least a portion of the 1-1 signal transmission line 122, the 1-2 signal transmission line 124, and the second ground portion 125. The 2-2 insulation portion 132 may be stacked on at least a portion of the second ground portion 125 and at least a portion of the second signal transmission line 126 and the third ground portion 129.

According to an example embodiment, the conductive adhesive layer 140 may include a conductive material. The conductive adhesive layer 140 may include a metal powder in a dielectric material, thereby representing a characteristic that may be conducted with anisotropy or isotropy.

According to various embodiments, the conductive adhesive layer 140 may enclose the first insulation portion 110, the 2-1 insulation portion 131, and the 2-2 insulation portion 132. The conductive adhesive layer 140 may be electrically connected to the first ground portion 121, the second ground portion 125, and the third ground portion 129. The conductive adhesive layer 140 may shield the 1-1 signal transmission line 122, the 1-2 signal transmission line 124, and the second signal transmission lines 126 while enclosing the first insulation portion 110, the 2-1 insulation portion 131, and the 2-2 insulation portion 132, thereby preventing crosstalk generated between signals received in the 1-1 signal transmission line 122, the 1-2 signal transmission line 124, and the second signal transmission lines 126 and signals transmitted to the outside.

According to various embodiments, the 1-1 signal transmission line 122 and the 1-2 signal transmission line 124 may be enclosed by the first ground portion 121, the second ground portion 125, and the conductive adhesive layer 140 to shield noise transferred from the outside. The second signal transmission line 126 may be enclosed by the second ground portion 125, the third ground portion 129, and the conductive shielding layer 140 to shield noise transferred from the outside.

According to an embodiment, the shielding portion 150 may include a conductive material. The shielding portion 150 may include an electromagnetic interference (EMI) film. The shielding portion 150 may be formed using a metal sputtering method. The shielding portion 150 may prevent and/or reduce electromagnetic waves from being exposed to the outside of the flexible flat cable 100.

According to various embodiments, the shielding portion 150 may be adhered to the outside of the conductive adhesive layer 140 to perform a shielding function. Because the conductive adhesive layer 140, the shielding portion 150, the first ground portion 121, the second ground portion 125, and the third ground portion 129 enclose the 1-1 signal transmission line 122, the 1-2 signal transmission line 124, and the second signal transmission line 126, shielding efficiency may be improved.

According to various embodiments, shielding efficiency of the conductive adhesive layer 140 may vary according to a level in which a conductive material is included in a conductive adhesive. In consideration of shielding efficiency of the conductive adhesive layer 140, the shielding portion 150 may be selectively include a conductive material or a non-conductive material. For example, when shielding efficiency of the conductive adhesive layer 140 is low, the shielding portion 150 may be made of a conductive material to compensate a shielding performance of the conductive adhesive layer 140. For example, when shielding efficiency of the conductive adhesive layer 140 is high, the shielding portion 150 may include a non-conductive material.

According to various embodiments, the shielding portion 150 may include a layer or a film. The shielding portion 150 may be configured with a conductive adhesive layer and an insulating layer. The shielding portion 150 may be configured with a conductive adhesive layer, a metal layer, and an insulating layer. The shielding portion 150 may be equally applied to the shielding portion described in the following embodiments.

Figure 2:
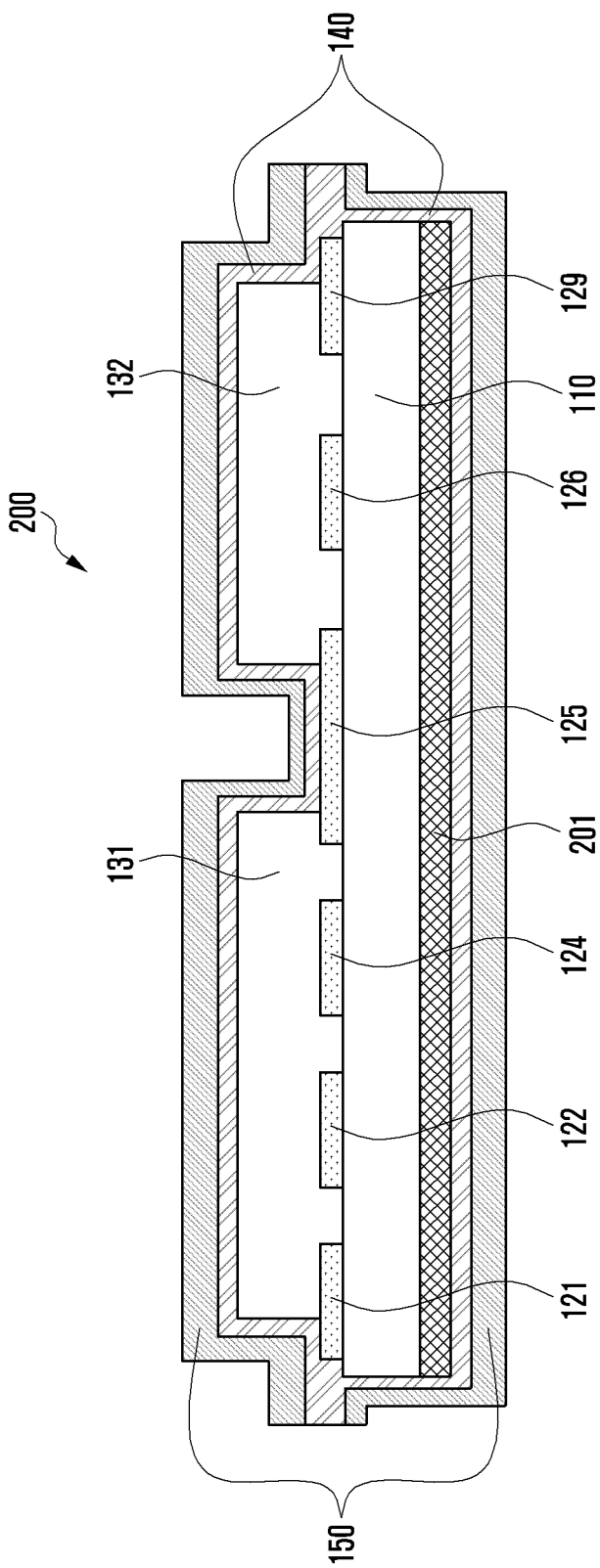
FIG. 2 is a cross-sectional view illustrating an example configuration of a flexible flat cable according to an example embodiment of the disclosure.

FIG. 2 is a cross-sectional view illustrating an example configuration of a flexible flat cable according to an example embodiment of the disclosure.

In a description of FIG. 2, a description of the same configuration and functions as those of the foregoing example embodiment of FIG. 1 may not be repeated. In the example embodiment of FIG. 2, a description of the same configuration and functions as those of other embodiments may not be repeated.

According to an embodiment, a flexible flat cable 200 of FIG. 2 may include a first insulation portion 110, first ground portion 121, second ground portion 125, third ground portion 129, 1-1 signal transmission line 122, 1-2 signal transmission line 124, second signal transmission line 126, 2-1 insulation portion 131, 2-2 insulation portion 132, conductive adhesive layer 140, and shielding portion 150 described in the example embodiment of FIG. 1 and have the same or similar disposition structure.

According to various embodiments, the first ground portion 121, the 1-1 signal transmission line 122, the 1-2 signal transmission line 124, the second ground portion 125, the second signal transmission line 126, and the third ground portion 129 may be disposed at predetermined intervals on the first insulation portion 110. At least one power line (not illustrated) may be disposed between the first ground portion 121 and the second ground portion 125. At least one power line (not illustrated) may be disposed between the second ground portion 125 and the third ground portion 129.

According to various embodiments, the 2-1 insulation portion 131 may be stacked on at least a portion of the first ground portion 121 and at least a portion of the 1-1 signal transmission line 122, the 1-2 signal transmission line 124, and the second ground portion 125. The 2-2 insulation portion 132 may be stacked on at least a portion of the second ground portion 125 and at least a portion of the second signal transmission line 126 and the third ground portion 129.

According to various embodiments, the conductive adhesive layer 140 may enclose the first insulation portion 110, the 2-1 insulation portion 131, and the 2-2 insulation portion 132. The conductive adhesive layer 140 may be electrically connected to the first ground portion 121, the second ground portion 125, and the third ground portion 129. The conductive adhesive layer 140 may shield the 1-1 signal transmission line 122, the 1-2 signal transmission line 124, and the second signal transmission line 126 while enclosing the first insulation portion 110, the 2-1 insulation portion 131, and the 2-2 insulation portion 132.

According to various embodiments, the shielding portion 150 may be adhered to the outside of the conductive adhesive layer 140 to perform a shielding function.

With reference to FIG. 2, the flexible flat cable 200 according to an example embodiment of the disclosure may include a first mesh copper layer 201.

According to an embodiment, the first mesh copper layer 201 may be disposed between a lower surface of the first insulation portion 110 and the conductive adhesive layer 140 provided under the flexible flat cable 200. The first mesh copper layer 201 may be configured such that the flexible flat cable 200 has flexibility. The first mesh copper layer 201 may reduce a loss in transmission of a high speed signal.

According to various embodiments, the flexible flat cable 200 of FIG. 2 is one cable and may have a structure in which cross sections cross each other.

Figure 3:
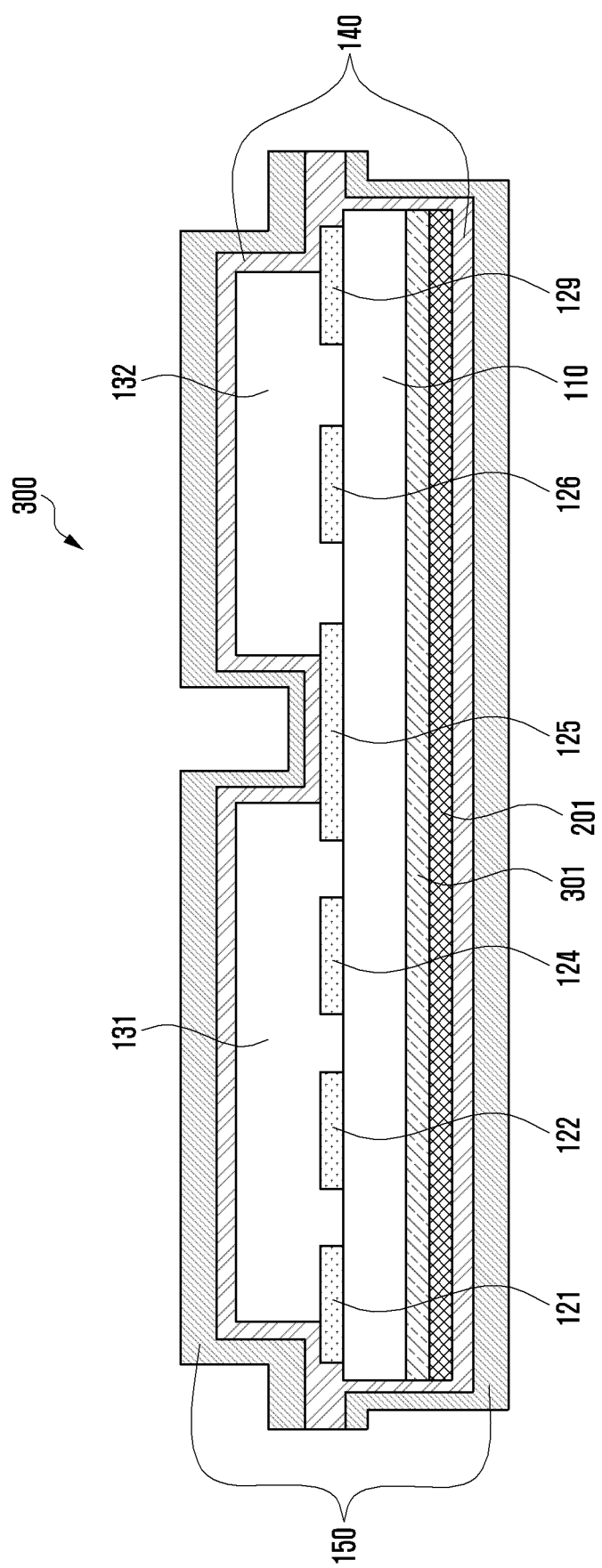
FIG. 3 is a cross-sectional view illustrating an example configuration of a flexible flat cable according to an example embodiment of the disclosure.

FIG. 3 is a cross-sectional view illustrating an example configuration of a flexible flat cable according to an example embodiment of the disclosure.

In a description of FIG. 3, a description of the same configuration and functions as those of the example embodiment of FIG. 1 and the example embodiment of FIG. 2 may not be repeated. In the example embodiment of FIG. 3, a description of the same configuration and functions as those of other embodiments may not be repeated.

According to an embodiment, a flexible flat cable 300 of FIG. 3 may include the first insulation portion 110, the first ground portion 121, the second ground portion 125, the third ground portion 129, the 1-1 signal transmission line 122, the 1-2 signal transmission line 124, the second signal transmission line 126, the 2-1 insulation portion 131, the 2-2 insulation portion 132, the conductive adhesive layer 140, and the shielding portion 150 described in the example embodiment of FIG. 1 and have the same disposition structure.

According to an example embodiment, the flexible flat cable 300 of FIG. 3 may include the first mesh copper layer 201 described in the example embodiment of FIG. 2. The first mesh copper layer 201 may be disposed on the conductive adhesive layer 140 provided under the flexible flat cable 300. The first mesh copper layer 201 may be configured such that the flexible flat cable 300 has flexibility. The first mesh copper layer 201 may reduce a loss in transmission of a high speed signal.

With reference to FIG. 3, a flexible flat cable 300 according to an example embodiment of the disclosure may include a bonding sheet 301.

According to an example embodiment, the bonding sheet 301 may be disposed between a lower surface of the first insulating portion 110 and the first mesh copper layer 201. The bonding sheet 301 may improve adhesion to an internal configuration of the flexible flat cable 300. The bonding sheet 301 may perform an insulation function. According to various embodiments, the bonding sheet 301 may be removed. The bonding sheet 301 may be replaced, for example, with a prepreg. An air gap may be inserted into the bonding sheet 301. The bonding sheet 301 may be equally applied to the bonding sheet described in the following embodiments.

Figure 4:
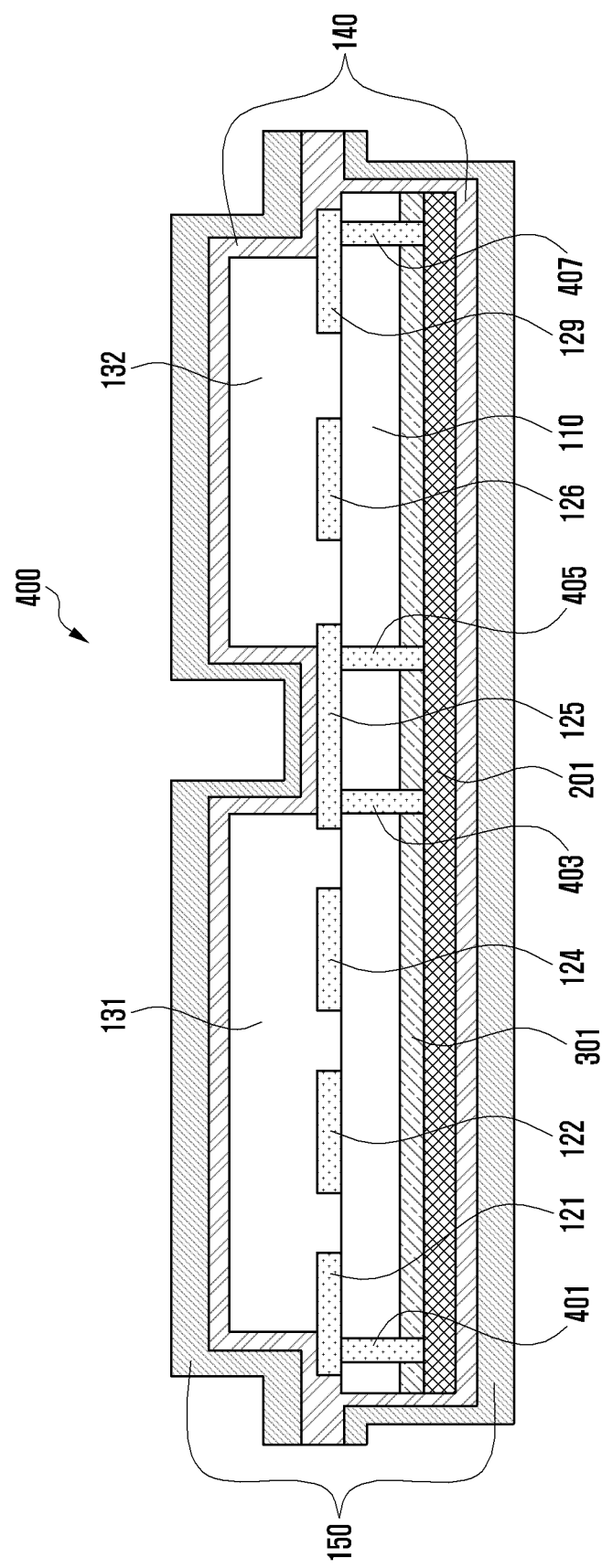
FIG. 4 is a cross-sectional view illustrating an example configuration of a flexible flat cable according to an example embodiment of the disclosure.

FIG. 4 is a cross-sectional view illustrating an example configuration of a flexible flat cable according to an example embodiment of the disclosure.

In a description of FIG. 4, a description of the same configuration and functions as those of the example embodiment of FIG. 1, the example embodiment of FIG. 2, and the example embodiment of FIG. 3 may not be repeated. In the example embodiment of FIG. 4, a description of the same configuration and functions as those of other embodiments may not be repeated.

According to an example embodiment, a flexible flat cable 400 of FIG. 4 may include the first insulation portion 110, the first ground portion 121, the second ground portion 125, the third ground portion 129, the 1-1 signal transmission line 122, the 1-2 signal transmission line 124, the second signal transmission line 126, the 2-1 insulation portion 131, the 2-2 insulation portion 132, the conductive adhesive layer 140, and the shielding portion 150 described in the example embodiment of FIG. 1 to the example embodiment of FIG. 3 and have the same disposition structure.

With reference to FIG. 4, a flexible flat cable 400 according to an example embodiment of the disclosure may include a first mesh copper layer 201, bonding sheet 301, and first to fourth vias 401, 403, 405, 407 (which may be referred to hereinafter as first via 401 to fourth via 407).

According to an embodiment, the first mesh copper layer 201 and the bonding sheet 301 may be disposed between a lower surface of the first insulation portion 110 and the conductive adhesive layer 140. The first mesh copper layer 201 may be disposed beneath the bonding sheet 301. A lower surface of the first mesh copper layer 201 may be adhered to the conductive adhesive layer 140. An upper surface of the first mesh copper layer 201 may be adhered to a lower surface of the bonding sheet 301. An upper surface of the bonding sheet 301 may be adhered to the first insulation portion 110.

According to various embodiments, the first mesh copper layer 201 may be configured such that the flexible flat cable 400 has flexibility. The bonding sheet 301 may improve adhesion to an internal configuration of the flexible flat cable 400. According to various embodiments, the bonding sheet 301 may be removed. The bonding sheet 301 may be replaced with a prepreg. An air gap may be inserted into the bonding sheet 301.

According to an example embodiment, the first via 401 to the fourth via 407 may have a structure capable of conducting heterogeneous metals. The first via 401 to the fourth via 407 may include, for example, plating, sputtering, via hole plating, or the like.

According to various embodiments, by penetrating the first insulating portion 110 and the bonding sheet 301, the first via 401 may electrically connect the first ground portion 121 and the first mesh copper layer 201. By penetrating the first insulating portion 110 and the bonding sheet 301, the second via 403 may electrically connect the first end of the second ground portion 125 and the first mesh copper layer 201. By penetrating the first insulating portion 110 and the bonding sheet 301, the third via 405 may electrically connect the second end of the second ground portion 125 and the first mesh copper layer 201. By penetrating the first insulating portion 110 and the bonding sheet 301, the fourth via 407 may electrically connect the third ground portion 129 and the first mesh copper layer 201.

According to various embodiments, the first via 401 to the fourth via 407 may connect the first ground portion 121, the second ground portion 125, the third ground portion 129, and the first mesh copper layer 201, thereby enhancing a ground function.

According to various embodiments, the second via 403 and the third via 405 formed in the second ground portion 125 are electrically connected to the first mesh copper layer 201, thereby blocking the flow of radio waves (e.g., low speed signals) by the 1-1 signal transmission line 122 and the 1-2 signal transmission line 124 and radio waves (e.g., high speed signals) by the second signal transmission line 126.

According to various embodiments, because the 1-1 signal transmission line 122 and the 1-2 signal transmission line 124 are enclosed by the first ground portion 121, the second ground portion 125, the first via 401, the second via 403, the first mesh copper layer 201, and the conductive adhesive layer 140, noise transferred from the outside may be shielded. Because the second signal transmission line 126 is enclosed by the second ground portion 125, the third ground portion 129, the third via 405, the fourth via 407, the first mesh copper layer 201, and the conductive shielding layer 140, noise transferred from the outside may be shielded.

Figure 5:
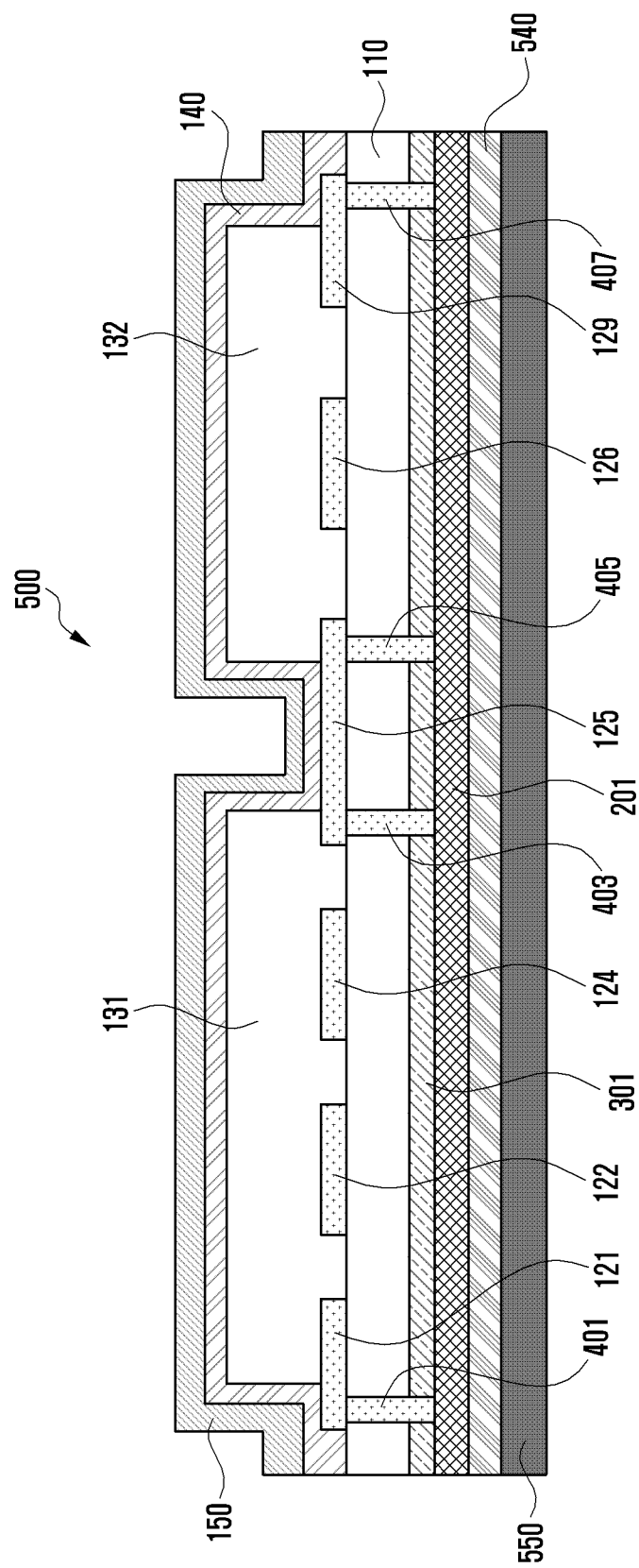
FIG. 5 is a cross-sectional view illustrating an example configuration of a flexible flat cable according to an example embodiment of the disclosure.

FIG. 5 is a cross-sectional view illustrating an example configuration of a flexible flat cable according to an example embodiment of the disclosure.

In a description of FIG. 5, a description of the same configuration and functions as those of the example embodiment of FIG. 4 may not be repeated. In the example embodiment of FIG. 5, a description of the same configuration and functions as those of other embodiments may not be repeated.

According to an embodiment, a flexible flat cable 500 of FIG. 5 may include the first insulation portion 110, the first ground portion 121, the second ground portion 125, the third ground portion 129, the 1-1 signal transmission line 122, the 1-2 signal transmission line 124, the second signal transmission line 126, the 2-1 insulation portion 131, the 2-2 insulation portion 132, the first mesh copper layer 201, the bonding sheet 301, and the first via 401 to the fourth via 407 described in the example embodiment of FIG. 4 and have the same disposition structure.

With reference to FIG. 5, the flexible flat cable 500 according to an example embodiment of the disclosure may include a non-conductive adhesive layer 540 and a third insulating portion 550.

According to an embodiment, the first mesh copper layer 201 and the bonding sheet 301 may be disposed between a lower surface of the first insulating portion 110 and the non-conductive adhesive layer 540. The first mesh copper layer 201 may be disposed beneath the bonding sheet 301. A lower surface of the first mesh copper layer 201 may be adhered to the non-conductive adhesive layer 540. An upper surface of the first mesh copper layer 201 may be adhered to a lower surface of the bonding sheet 301. An upper surface of the bonding sheet 301 may be adhered to the first insulation portion 110.

According to various embodiments, by penetrating the first insulating portion 110 and the bonding sheet 301, the first via 401 may electrically connect the first ground portion 121 and the first mesh copper layer 201. By penetrating the first insulating portion 110 and the bonding sheet 301, the second via 403 may electrically connect the first end of the second ground portion 125 and the first mesh copper layer 201. By penetrating the first insulating portion 110 and the bonding sheet 301, the third via 405 may electrically connect the second end of the second ground portion 125 and the first mesh copper layer 201. By penetrating the first insulating portion 110 and the bonding sheet 301, the fourth via 407 may electrically connect the third ground portion 129 and the first mesh copper layer 201.

According to an example embodiment, a conductive adhesive layer 140 may be disposed at outer surfaces of the 2-1 insulation portion 131 and the 2-2 insulation portion 132. The conductive adhesive layer 140 may be electrically connected to the first ground portion 121, the second ground portion 125, and the third ground portion 129.

According to an example embodiment, the non-conductive adhesive layer 540 may be disposed at a lower surface of the first mesh copper layer 201. According to various embodiments, the non-conductive adhesive layer 540 may be disposed at both side ends of the first mesh copper layer 201, both side ends of the bonding sheet 301 disposed on the first mesh copper layer 201, and both side ends of the first insulating portion 110. According to various embodiments, the bonding sheet 301 may be removed. The bonding sheet 301 may be replaced with a prepreg. An air gap may be inserted into the bonding sheet 301.

According to an example embodiment, the third insulating portion 550 may be adhered to an outer surface of the non-conductive adhesive layer 540. The third insulation portion 550 may be made, for example, of a material having an insulating property. The third insulation portion 550 may be made, for example, of a dielectric material. Because the first mesh copper layer 201 is made of a conductive material to maintain shielding efficiency of the flexible flat cable 500 according to an example embodiment, some of the conductive adhesive layer 140 and the shielding portions 150 of the example embodiments of FIGS. 1 to 4 may be replaced with a non-conductive material. Because of the non-conductive adhesive layer 540 and the third insulating portion 550, the flexible flat cable 500 according to an example embodiment may have an improved insulation performance.

Figure 6:
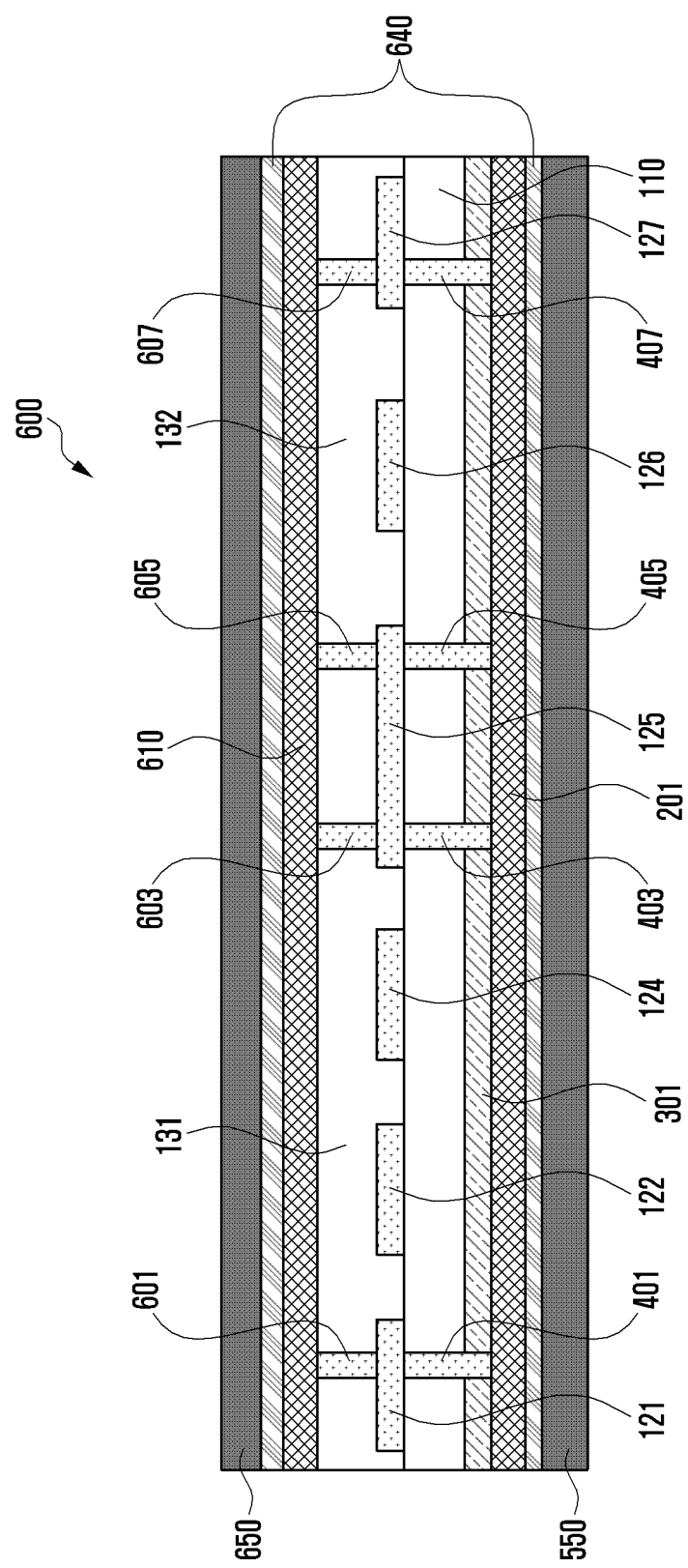
FIG. 6 is a cross-sectional view illustrating an example configuration of a flexible flat cable according to an example embodiment of the disclosure.

FIG. 6 is a cross-sectional view illustrating an example configuration of a flexible flat cable according to an example embodiment of the disclosure.

In a description of FIG. 6, a description of the same configuration and functions as those of the example embodiment of FIG. 5 may not be repeated. In the example embodiment of FIG. 6, a description of the same configuration and functions as those of other embodiments may not be repeated.

According to an embodiment, a flexible flat cable 600 of FIG. 6 may include the first insulation portion 110, the first ground portion 121, the second ground portion 125, the third ground portion 129, the 1-1 signal transmission line 122, the 1-2 signal transmission line 124, the second signal transmission line 126, the 2-1 insulation portion 131, the 2-2 insulating portion 132, the first mesh copper layer 201, the bonding sheet 301, the first via 401 to the fourth via 407, and the third insulating portion 550 described in the example embodiment of FIG. 5 and have the same disposition structure.

According to an example embodiment, the first mesh copper layer 201 and the bonding sheet 301 may be disposed between a lower surface of the first insulating portion 110 and a non-conductive adhesive layer 640 provided under the flexible flat cable 600. The first mesh copper layer 201 may be disposed beneath the bonding sheet 301. A lower surface of the first mesh copper layer 201 may be adhered to the non-conductive adhesive layer 640 provided under the flexible flat cable 600. An upper surface of the first mesh copper layer 201 may be attached to a lower surface of the bonding sheet 301. An upper surface of the bonding sheet 301 may be adhered to the first insulation portion 110. The third insulating portion 550 may be adhered to a lower surface of the non-conductive adhesive layer 640 provided in a lower portion. According to various embodiments, the bonding sheet 301 may be removed. The bonding sheet 301 may be replaced with a prepreg. An air gap may be inserted into the bonding sheet 301.

According to various embodiments, by penetrating the first insulating portion 110 and the bonding sheet 301, the first via 401 may electrically connect the first ground portion 121 and the first mesh copper layer 201. By penetrating the first insulating portion 110 and the bonding sheet 301, the second via 403 may electrically connect the first end of the second ground portion 125 and the first mesh copper layer 201. By penetrating the first insulating portion 110 and the bonding sheet 301, the third via 405 may electrically connect the second end of the second ground portion 125 and the first mesh copper layer 201. By penetrating the first insulating portion 110 and the bonding sheet 301, the fourth via 407 may electrically connect the third ground portion 129 and the first mesh copper layer 201.

With reference to FIG. 6, a flexible flat cable 600 according to an example embodiment of the disclosure may further include a second mesh copper layer 610 and a non-conductive adhesive layer 640, a fourth insulating portion 650, and a fifth via 601 to an eighth via 607 (e.g., vias 601, 603, 605, 607) having a different configuration from that of the example embodiment of FIG. 5.

According to an embodiment, the second mesh copper layer 610 may be disposed at upper surfaces of the 2-1 insulation portion 131 and the 2-2 insulation portion 132. The second mesh copper layer 610 may be configured together with the first mesh copper layer 201 such that the flexible flat cable 600 has flexibility.

According to an embodiment, the non-conductive adhesive layer 640 may be disposed at an upper surface of the second mesh copper layer 610. According to various embodiments, the non-conductive adhesive layer 640 may also be disposed at both side ends of the second mesh copper layer 610 and side surfaces of the 2-1 insulation portion 131 and the 2-2 insulation portion 132.

According to an example embodiment, the fourth insulating portion 650 may be attached to an outer surface of the non-conductive adhesive layer 640 disposed on the second mesh copper layer 610. The fourth insulating portion 650 may be made of a material having an insulating property. The fourth insulating portion 650 may be made of a dielectric material. According to an embodiment, because the first mesh copper layer 201 and the second mesh copper layer 610 are made of a conductive material, shielding efficiency of the flexible flat cable 600 according to an example embodiment is maintained; thus, the conductive adhesive layer 140 of the example embodiments of FIGS. 1 to 4 may be replaced with the non-conductive adhesive layer 640. Because of the non-conductive adhesive layer 640 and the fourth insulating portion 650, the flexible flat cable 600 according to an example embodiment may have an improved insulation performance.

According to an embodiment, the fifth via 601 to the eighth via 607 may have a structure capable of conducting heterogeneous metals. The fifth via 601 to the eighth via 607 may include plating, sputtering, via hole plating, or the like.

According to various embodiments, the fifth via 601 to the eighth via 607 may be disposed to correspond to the first via 401 to the fourth via 407 on a vertical axis with the first ground portion 121, the second ground portion 125, and the third ground portion 129 disposed therebetween.

According to various embodiments, by penetrating the 2-1 insulation portion 131, the fifth via 601 may electrically connect the first ground portion 121 and the second mesh copper layer 610. By penetrating the 2-1 insulation portion 131, the sixth via 603 may electrically connect the first end of the second ground portion 125 and the second mesh copper layer 610. By penetrating the 2-2 insulation portion 132, the seventh via 605 may electrically connect the second end of the second ground portion 125 and the second mesh copper layer 610. By penetrating the 2-2 insulation portion 132, the eighth via 607 may electrically connect the third ground portion 129 and the second mesh copper layer 610.

According to various embodiments, by connecting the first ground portion 121, the second ground portion 125, the third ground portion 129, and the second mesh copper layer 610, the fifth via 601 to the eighth via 807 may strengthen a ground function.

According to various embodiments, the sixth via 603 and the seventh via 605 formed in the second ground portion 125 are electrically connected to the second mesh copper layer 610, thereby blocking the flow of radio waves (e.g., low speed signals) by the 1-1 signal transmission line 122 and the 1-2 signal transmission line 124 and radio waves (e.g., high speed signals) by the second signal transmission line 126.

According to various embodiments, because the 1-1 signal transmission line 122 and the 1-2 signal transmission line 124 are enclosed by the first ground portion 121, the second ground portion 125, the fifth via 601, the six via 603, and the second mesh copper layer 610, noise transferred from the outside may be shielded. Because the second signal transmission line 126 is enclosed by the second ground portion 125, the third ground portion 129, the seventh via 605, the eighth via 607, and the second mesh copper layer 610, noise transferred from the outside may be shielded.

Figure 7:
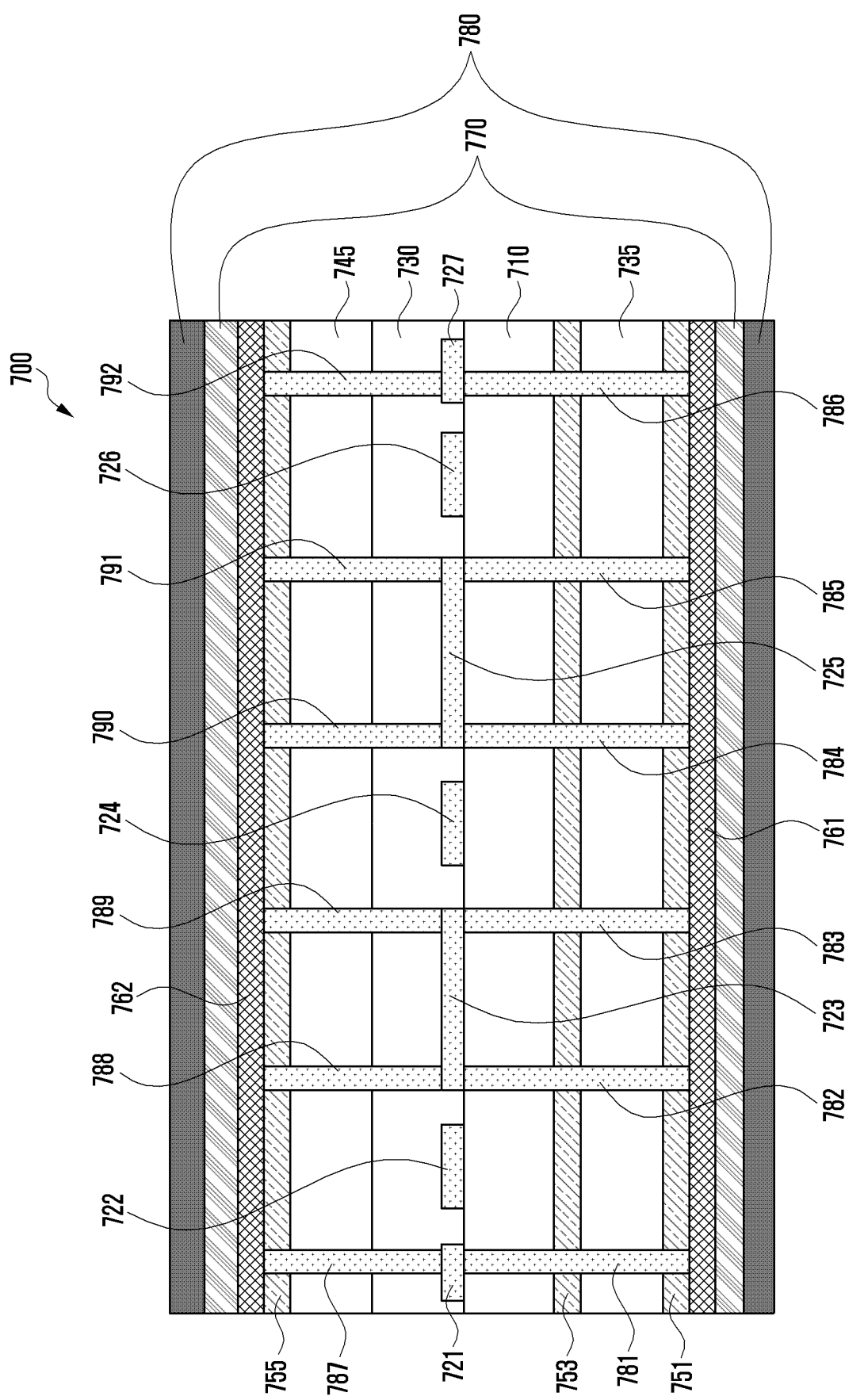
FIG. 7 is a cross-sectional view illustrating an example configuration of a flexible flat cable according to an example embodiment of the disclosure.

FIG. 7 is a cross-sectional view illustrating an example configuration of a flexible flat cable according to an example embodiment of the disclosure.

In the description of FIG. 7, a description of the same configuration and functions as those of the example embodiment of FIG. 1 to the example embodiment of FIG. 6 may not be repeated. In the example embodiment of FIG. 7, a description of the same configuration and functions as those of other embodiments may not be repeated.

With reference to FIG. 7, a flexible flat cable 700 according to an example embodiment of the disclosure may include a first insulation portion 710, first ground portion 721, second ground portion 723, third ground portion 725, fourth ground portion 727, first signal transmission line 722, second signal transmission line 724, third signal transmission line 726, second insulation portion 730, third insulation portion 735, fourth insulating portion 745, first bonding sheet 751, second bonding sheet 753, third bonding sheet 755, first mesh copper layer 761, second mesh copper layer 762, non-conductive adhesive layer 770, fifth insulation portion 780, and first via 781 to twelfth via 792 (e.g., 781, 782, 783, 784, 785, 786, 787, 788, 789, 790, 791, 792).

According to an example embodiment, the first insulating portion 710 may be made of a material having an insulating property. The first insulation portion 710 may include a copper clad laminate (CCL).

According to an embodiment, the first ground portion 721, the second ground portion 723, the third ground portion 725, and the fourth ground portion 727 may be disposed at predetermined intervals on the first insulation portion 710. The first ground portion 721, the second ground portion 723, the third ground portion 725, and the fourth ground portion 727 may be made of a conductive metal (e.g., copper) in which a current may flow.

According to an embodiment, the first signal transmission line 722, the second signal transmission line 724, and the third signal transmission line 726 may be disposed at predetermined intervals on the first insulation portion 710. The first signal transmission line 722, the second signal transmission line 724, and the third signal transmission line 726 may be made of a conductive metal (e.g., copper) in which a current may flow.

According to various embodiments, the first signal transmission line 722 may be disposed between the first ground portion 721 and the second ground portion 723. The second signal transmission line 724 may be disposed between the second ground portion 723 and the third ground portion 725. The third signal transmission line 726 may be disposed between the third ground portion 725 and the fourth ground portion 727.

According to various embodiments, the first ground portion 721, the second ground portion 723, the third ground portion 725, the fourth ground portion 727, the first signal transmission line 722, the second signal transmission line 724, and the third signal transmission line 726 may be formed by stacking a copper thin film layer on the first insulating portion 710 and etching at least a portion of the copper thin film layer. At least one power line (not illustrated) may be disposed between the first ground portion 721 and the second ground portion 723. At least one power line (not illustrated) may be disposed between the second ground portion 723 and the third ground portion 725. At least one power line (not illustrated) may be disposed between the third ground portion 725 and the fourth ground portion 727.

According to an embodiment, the second insulation portion 730, the third insulation portion 735, the fourth insulation portion 745, and the fifth insulation portion 780 may be made of a material having an insulating property. The second insulation portion 730, the third insulation portion 735, the fourth insulation portion 745, and the fifth insulation portion 780 may include a cover layer.

According to various embodiments, the second insulation portion 730 may be disposed on the first ground portion 721, the first signal transmission line 722, the second ground portion 723, the second signal transmission line 724, the third ground portion 725, the third signal transmission line 726, and the fourth ground portion 727.

According to an embodiment, the third insulation portion 735 may be disposed under the first insulation portion 710. A first surface (e.g., upper surface) of a first bonding sheet 751 may be adhered to a lower surface of the third insulating portion 735. The first mesh copper layer 761 may be attached to a second surface (e.g., the lower surface) of the first bonding sheet 751.

According to an example embodiment, the second bonding sheet 753 may be disposed between the first insulating portion 710 and the third insulating portion 735 to adhere the first insulating portion 710 and the third insulating portion 735.

According to an embodiment, the fourth insulation portion 745 may be disposed on the second insulation portion 730. A first surface (e.g., lower surface) of the third bonding sheet 755 may be attached to an upper surface of the fourth insulating portion 745. The second mesh copper layer 762 may be adhered to a second surface (e.g., upper surface) of the third bonding sheet 755.

According to an embodiment, the first bonding sheet 751, the second bonding sheet 753, and the third bonding sheet 755 may improve adhesion to an internal configuration of the flexible flat cable 700. The first bonding sheet 751, the second bonding sheet 753, and the third bonding sheet 755 may perform an insulation function. The first mesh copper layer 761 and the second mesh copper layer 762 may be configured such that the flexible flat cable 700 has flexibility.

According to various embodiments, the first bonding sheet 751, the second bonding sheet 753, and the third bonding sheet 755 may be removed. The first bonding sheet 751, the second bonding sheet 753, and the third bonding sheet 755 may be replaced with a prepreg. An air gap may be inserted into the first bonding sheet 751, the second bonding sheet 753, and the third bonding sheet 755.

According to an example embodiment, the non-conductive adhesive layer 770 may be disposed at a lower surface of the first mesh copper layer 761 and an upper surface of the second mesh copper layer 762. According to various embodiments, the non-conductive adhesive layer 770 may enclose both side ends of the first mesh copper layer 761, both side ends of the first bonding sheet 751, both side ends of the third insulating portion 735, both side ends of the second bonding sheet 753, both side ends of the first insulation portion 710, outer ends of each of the first ground portion 721 and the fourth ground portion 727, both side ends of the second insulation portion 730, both side ends of the fourth insulating portion 745, both side ends of the third bonding sheet 755, and both side ends of the second mesh copper layer 762.

According to an embodiment, the fifth insulating portion 780 may be disposed at outer surfaces (e.g., upper and lower surfaces) of the non-conductive adhesive layer 770. The fifth insulation portion 780 may be made of a material having insulating properties.

According to an example embodiment, a first via 781 to a twelfth via 792 may have a structure capable of conducting heterogeneous metals. The first via 781 to the twelfth via 792 may include plating, sputtering, via hole plating, or the like.

According to an example embodiment, by penetrating the first insulating portion 710, the second bonding sheet 753, the third insulating portion 735, and the first bonding sheet 751, the first via 781 may electrically connect the first ground portion 721 and the first mesh copper layer 761. By penetrating the first insulation portion 710, the second bonding sheet 753, the third insulation portion 735, and the first bonding sheet 751, the second via 782 may electrically connect the first end of the second ground portion 723 and the first mesh copper layer 761. By penetrating the first insulation portion 710, the second bonding sheet 753, the third insulation portion 735, and the first bonding sheet 751, the third via 783 may electrically connect the second end of the second ground portion 723 and the first mesh copper layer 761. By penetrating the first insulation portion 710, the second bonding sheet 753, the third insulation portion 735, and the first bonding sheet 751, the fourth via 784 may electrically connect the first end of the third ground portion 725 and the first mesh copper layer 761. By penetrating the first insulation portion 710, the second bonding sheet 753, the third insulation portion 735, and the first bonding sheet 751, the fifth via 785 may electrically connect the second end of the third ground portion 725 and the first mesh copper layer 761. By penetrating the first insulation portion 710, the second bonding sheet 753, the third insulation portion 735, and the first bonding sheet 751, the sixth via 786 may electrically connect the fourth ground portion 727 and the first mesh copper layer 761.

According to an example embodiment, by penetrating through the second insulation portion 730, the fourth insulation portion 745, and the third bonding sheet 755, the seventh via 781 may electrically connect the first ground portion 721 and the second mesh copper layer 762. By penetrating the second insulation portion 730, the fourth insulation portion 745, and the third bonding sheet 755, the eighth via 788 may electrically connect the first end of the second ground portion 723 and the second mesh copper layer 762. By penetrating the second insulation portion 730, the fourth insulation portion 745, and the third bonding sheet 755, the ninth via 789 may electrically connect the second end of the second ground portion 723 and the second mesh copper layer 762. By penetrating the second insulation portion 730, the fourth insulation portion 745, and the third bonding sheet 755, the tenth via 790 may electrically connect the first end of the third ground portion 725 and the second mesh copper layer 762. By penetrating the second insulation portion 730, the fourth insulation portion 745, and the third bonding sheet 755, the eleventh via 791 may electrically connect the second end of the third ground portion 725 and the second mesh copper layer 762. By penetrating the second insulation portion 730, the fourth insulation portion 745, and the third bonding sheet 755, the twelfth via 792 may electrically connect the fourth ground portion 727 and the second mesh copper layer 762.

According to an embodiment, the seventh via 787 to the twelfth via 792 may be disposed to correspond to the first via 781 to the sixth via 786 on a vertical axis with the first ground portion 721, the second ground portion 723, the third ground portion 725, and the fourth ground portion 727 interposed therebetween.

Figure 8:
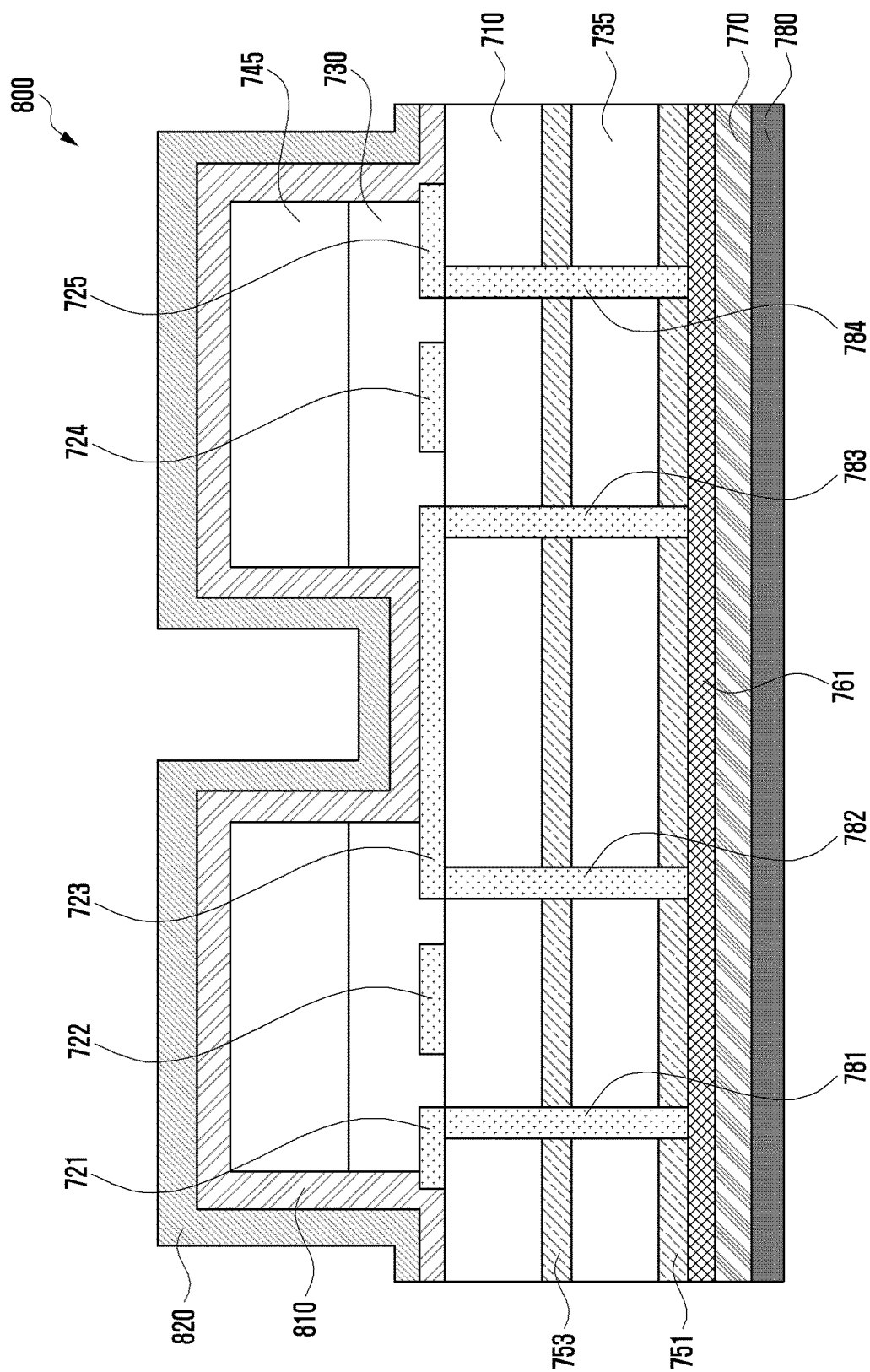
FIG. 8 is a cross-sectional view illustrating an example configuration of a flexible flat cable according to an example embodiment of the disclosure.

FIG. 8 is a cross-sectional view illustrating an example configuration of a flexible flat cable according to an example embodiment of the disclosure.

In a description of FIG. 8, a description of the same configuration and functions as those of the example embodiment of FIG. 5 and the example embodiment of FIG. 7 may not be repeated. In the example embodiment of FIG. 8, a description of the same configuration and functions as those of other embodiments may not be repeated.

With reference to FIG. 8, a flexible flat cable 800 according to an example embodiment of the disclosure may include a first insulation portion 710, first ground portion 721, second ground portion 723, third ground portion 725, first signal transmission line 722, second signal transmission line 724, second insulation portion 730, third insulation portion 735, fourth insulation portion 745, first bonding sheet 751, second bonding sheet 753, first mesh copper layer 761, non-conductive adhesive layer 770, fifth insulating portion 780, conductive adhesive layer 810, shielding layer 820, and first via 781 to fourth via 784 (e.g., 781, 782, 783, 784).

According to an example embodiment, the first insulating portion 710 may be made of a material having an insulating property. The first insulation portion 110 may include a copper clad laminate (CCL).

According to an embodiment, the first ground portion 721, the second ground portion 723, and the third ground portion 725 may be disposed at predetermined intervals on the first insulation portion 710.

According to various embodiments, the first signal transmission line 722 and the second signal transmission line 724 may be disposed at predetermined intervals on the first insulation portion 710.

According to an embodiment, the first signal transmission line 722 may be disposed between the first ground portion 721 and the second ground portion 723. The second signal transmission line 724 may be disposed between the second ground portion 723 and the third ground portion 725.

According to an embodiment, the second insulation portion 730, the third insulation portion 735, the fourth insulation portion 745, and the fifth insulation portion 780 may be made of a material having an insulating property. The second insulation portion 730, the third insulation portion 735, the fourth insulation portion 745, and the fifth insulation portion 780 may include a cover layer.

According to various embodiments, the second insulation portion 730 may be disposed on the first ground portion 721, the first signal transmission line 722, the second ground portion 723, the second signal transmission line 724, and the third ground portion 725.

According to an embodiment, the third insulation portion 735 may be disposed under the first insulation portion 710. A first surface (e.g., upper surface) of the first bonding sheet 751 may be adhered to a lower surface of the third insulating portion 735. The first mesh copper layer 761 may be adhered to a second surface (e.g., lower surface) of the first bonding sheet 751.

According to an example embodiment, the second bonding sheet 753 may be disposed between the first insulating portion 710 and the third insulating portion 735 to adhere the first insulating portion 710 and the third insulating portion 735. The fourth insulating portion 745 may be disposed on the second insulating portion 730.

According to an example embodiment, the non-conductive adhesive layer 770 may be disposed at a lower surface of the first mesh copper layer 761. The non-conductive adhesive layer 770 may enclose both side ends of the first mesh copper layer 761, both side ends of the first bonding sheet 751, both side ends of the third insulating portion 735, both side ends of the second bonding sheet 753, and both side ends of the first insulating portion 710.

According to an example embodiment, the fifth insulating portion 780 may be disposed at an outer surface (e.g., lower surface) of the non-conductive adhesive layer 770.

According to an example embodiment, the first via 781 to the fourth via 784 may have a structure capable of conducting heterogeneous metals.

According to an example embodiment, by penetrating the first insulating portion 710, the second bonding sheet 753, the third insulating portion 735, and the first bonding sheet 751, the first via 781 may electrically connect the first ground portion 721 and the first mesh copper layer 761. By penetrating the first insulation portion 710, the second bonding sheet 753, the third insulation portion 735, and the first bonding sheet 751, the second via 782 may electrically connect the first end of the second ground portion 723 and the first mesh copper layer 761. By penetrating the first insulation portion 710, the second bonding sheet 753, the third insulation portion 735, and the first bonding sheet 751, the third via 783 may electrically connect the second end of the second ground portion 723 and the first mesh copper layer 761. By penetrating the first insulation portion 710, the second bonding sheet 753, the third insulation portion 735, and the first bonding sheet 751, the fourth via 784 may electrically connect the third ground portion 725 and the first mesh copper layer 761.

According to various embodiments, the first bonding sheet 751 and the second bonding sheet 753 may be removed. The first bonding sheet 751 and the second bonding sheet 753 may be replaced with prepreg. An air gap may inserted into the first bonding sheet 751 and the third bonding sheet 755.

According to an embodiment, the conductive adhesive layer 810 may enclose at least a portion of both side ends of the second insulating portion 730 and an outer surface of the fourth insulating portion 745. The conductive adhesive layer 810 may be electrically connected to at least a portion of the first ground portion 721, the second ground portion 723, and the third ground portion 725.

According to an embodiment, the shielding portion 820 may be made of a conductive material. The shielding portion 820 may be adhered to the outside of the conductive adhesive layer 810 to perform a shielding function.

Figure 9:
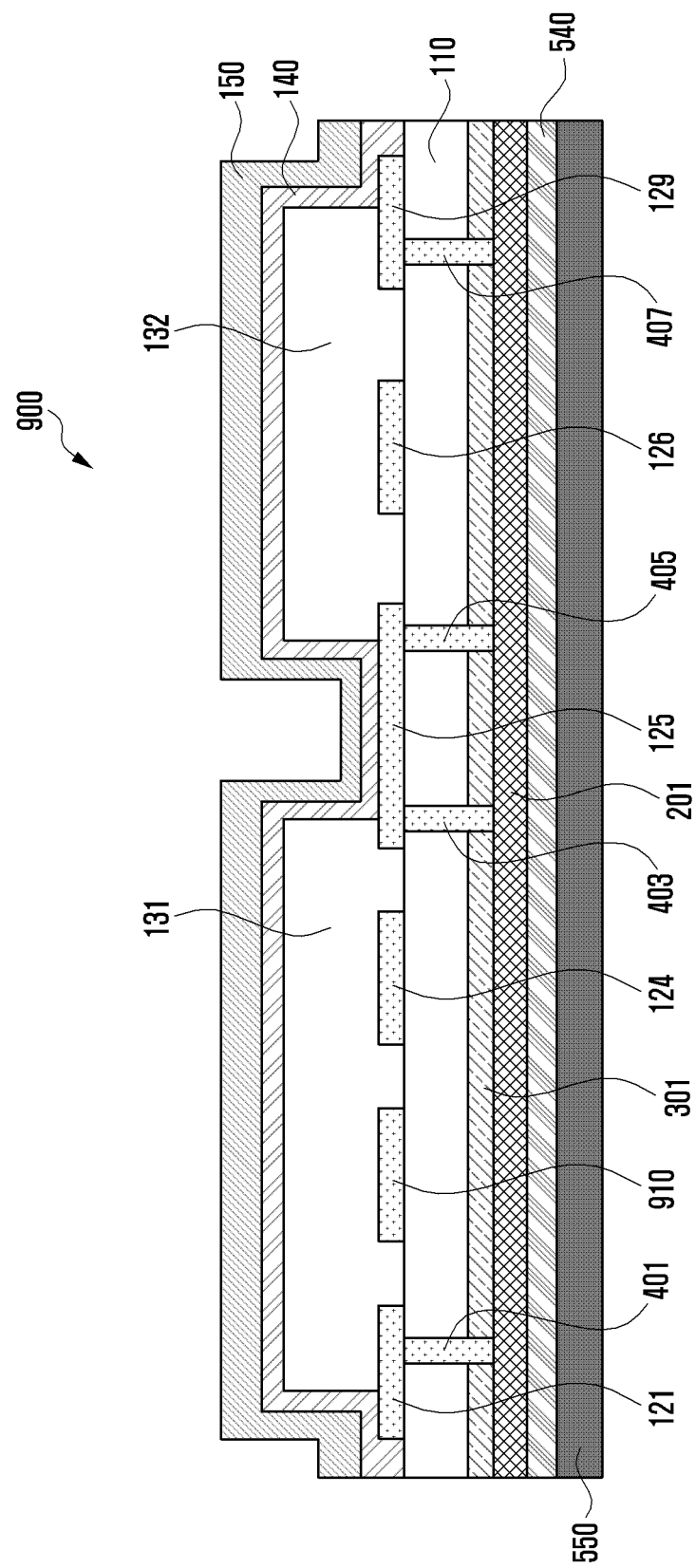
FIG. 9 is a cross-sectional view illustrating an example configuration of a flexible flat cable according to an example embodiment of the disclosure.

FIG. 9 is a cross-sectional view illustrating an example configuration of a flexible flat cable according to an example embodiment of the disclosure.

In a description of FIG. 9, a description of the same configuration and functions as those of the example embodiment of FIG. 1 to the example embodiment of FIG. 5 and the example embodiment of FIG. 8 may not be repeated. In the example embodiment of FIG. 9, a description of the same configuration and functions as those of other embodiments may not be repeated.

According to an embodiment, a flexible flat cable 900 of FIG. 9 may include the first insulating portion 110, the first ground portion 121, the second ground portion 125, the third ground portion 129, the 1-2 signal transmission line 124, the second signal transmission line 126, the 2-1 insulating portion 131, the 2-2 insulating portion 132, the conductive adhesive layer 140, the shielding portion 150, the bonding sheet 301, the first mesh copper layer 201, the first via 401 to the fourth via 407, the non-conductive adhesive layer 540, and the third insulation portion 550 described in the example embodiment of FIG. 1 to the example embodiment of FIG. 5 and have the same disposition structure.

According to an example embodiment, the first mesh copper layer 201 and the bonding sheet 301 may be disposed between a lower surface of the first insulating portion 110 and the non-conductive adhesive layer 540. The first mesh copper layer 201 may be disposed beneath the bonding sheet 301. A lower surface of the first mesh copper layer 201 may be adhered to the non-conductive adhesive layer 540. An upper surface of the first mesh copper layer 201 may be adhered to a lower surface of the bonding sheet 301. An upper surface of the bonding sheet 301 may be adhered to the first insulation portion 110.

According to an example embodiment, the conductive adhesive layer 140 may enclose the 2-1 insulation portion 131 and the 2-2 insulation portion 132. The conductive adhesive layer 140 may be electrically connected to at least a portion of the first ground portion 121, the second ground portion 125, and the third ground portion 129.

According to an embodiment, the shielding portion 150 may be adhered to the outside of the conductive adhesive layer 140 to perform a shielding function.

According to various embodiments, the first ground portion 121, the second ground portion 125, and the third ground portion 129 may be disposed at predetermined intervals on the first insulation portion 110. The 1-2 signal transmission line 124 and the second signal transmission line 126 may be disposed at predetermined intervals on the first insulation portion 110. The 1-2 signal transmission line 124 may be disposed between the first ground portion 121 and the second ground portion 125. The second signal transmission line 126 may be disposed between the second ground portion 125 and the third ground portion 129.

According to an embodiment, a first power line 910 may be disposed between the first ground portion 121 and the second ground portion 125. Further, at least one power line (not illustrated) may be disposed between the second ground portion 125 and the third ground portion 129.

Figure 10:
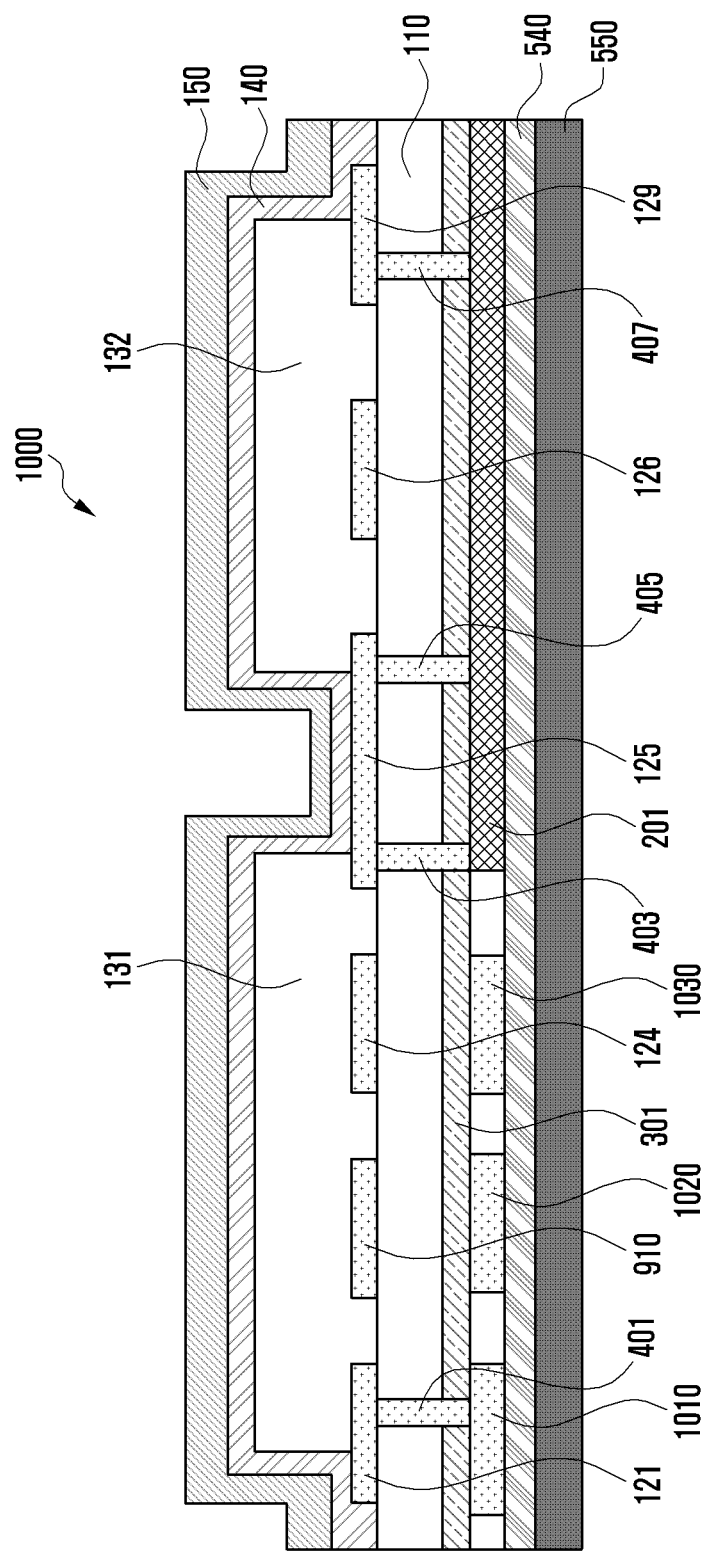
FIG. 10 is a cross-sectional view illustrating an example configuration of a flexible flat cable according to an example embodiment of the disclosure.

FIG. 10 is a cross-sectional view illustrating an example configuration of a flexible flat cable according to an example embodiment of the disclosure.

In a description of FIG. 10, a description of the same configuration and functions as those of the example embodiment of FIG. 1 to the example embodiment of FIG. 5 and the example embodiment of FIG. 9 may not be repeated. In the example embodiment of FIG. 10, a description of the same configuration and functions as those of other embodiments may not be repeated.

According to an embodiment, a flexible flat cable 1000 of FIG. 10 may include the first insulating portion 110, the first ground portion 121, the second ground portion 125, the third ground portion 129, the 1-2 signal transmission line 124, the second signal transmission line 126, the first power line 910, the 2-1 insulation portion 131, the 2-2 insulation portion 132, the conductive adhesive layer 140, the shielding portion 150, the bonding sheet 301, the first mesh copper layer 201, the first via 401 to the fourth via 407, the non-conductive adhesive layer 540, and the third insulation portion 550 described in the example embodiment of FIG. 1 to the example embodiment of FIG. 5 and the example embodiment of FIG. 9 and have the same disposition structure.

According to an embodiment, the bonding sheet 301 may be disposed at a lower surface of the first insulation portion 110. The first mesh copper layer 201 may be adhered to a lower surface of the bonding sheet 301. The first mesh copper layer 201 may be at least partially removed from a lower surface of the bonding sheet 301. The first mesh copper layer 201 may be disposed only at a first side surface (e.g., the right side). For example, the first mesh copper layer 201 may be extended from the lower end of the second via 403 toward the fourth via 407. The first mesh copper layer 201 may not be disposed at the second side surface (e.g., the left side). For example, the first mesh copper layer 201 may be removed using punching or etching from the lower end of the second via 403 towards the first via 401.

According to an embodiment, a fourth ground portion 1010, a third signal line 1020, and a second power line 1030 may be disposed at predetermined intervals between the bonding sheet 301 and the non-conductive adhesive layer 540 in which the first mesh copper layer 201 is not formed. By disposing the fourth ground portion 1010, the third signal line 1020, and the second power line 1030 in an area in which the first mesh copper layer 201 is not formed, the flexible flat cable 1000 according to the example embodiment of FIG. 10 may be designed compactly.

According to an example embodiment, by penetrating the first insulation portion 110 and the bonding sheet 301, the first via 401 may electrically connect the first ground portion 121 and the fourth ground portion 1010. By penetrating the first insulating portion 110 and the bonding sheet 301, the second via 403 may electrically connect the first end of the second ground portion 125 and the first mesh copper layer 201. By penetrating the first insulating portion 110 and the bonding sheet 301, the third via 405 may electrically connect the second end of the second ground portion 125 and the first mesh copper layer 201. By penetrating the first insulating portion 110 and the bonding sheet 301, the fourth via 407 may electrically connect the third ground portion 129 and the first mesh copper layer 201.

According to an example embodiment, the conductive adhesive layer 140 may enclose the 2-1 insulation portion 131 and the 2-2 insulation portion 132. The conductive adhesive layer 140 may be electrically connected to at least a portion of the first ground portion 121, the second ground portion 125, and the third ground portion 129.

According to an embodiment, the shielding portion 150 may be adhered to the outside of the conductive adhesive layer 140 to perform a shielding function.

According to various embodiments, the first ground portion 121, the second ground portion 125, and the third ground portion 129 may be disposed at predetermined intervals on the first insulation portion 110. The 1-2 signal transmission line 124 and the second signal transmission line 126 may be disposed at predetermined intervals on the first insulation portion 110. The 1-2 signal transmission line 124 may be disposed between the first ground portion 121 and the second ground portion 125. The second signal transmission line 126 may be disposed between the second ground portion 125 and the third ground portion 129.

According to an embodiment, the first power line 910 may be disposed between the first ground portion 121 and the second ground portion 125. According to various embodiments, the first power line 910 may be disposed between the first ground portion 121 and the 1-2 signal transmission line 124.

Figure 11:
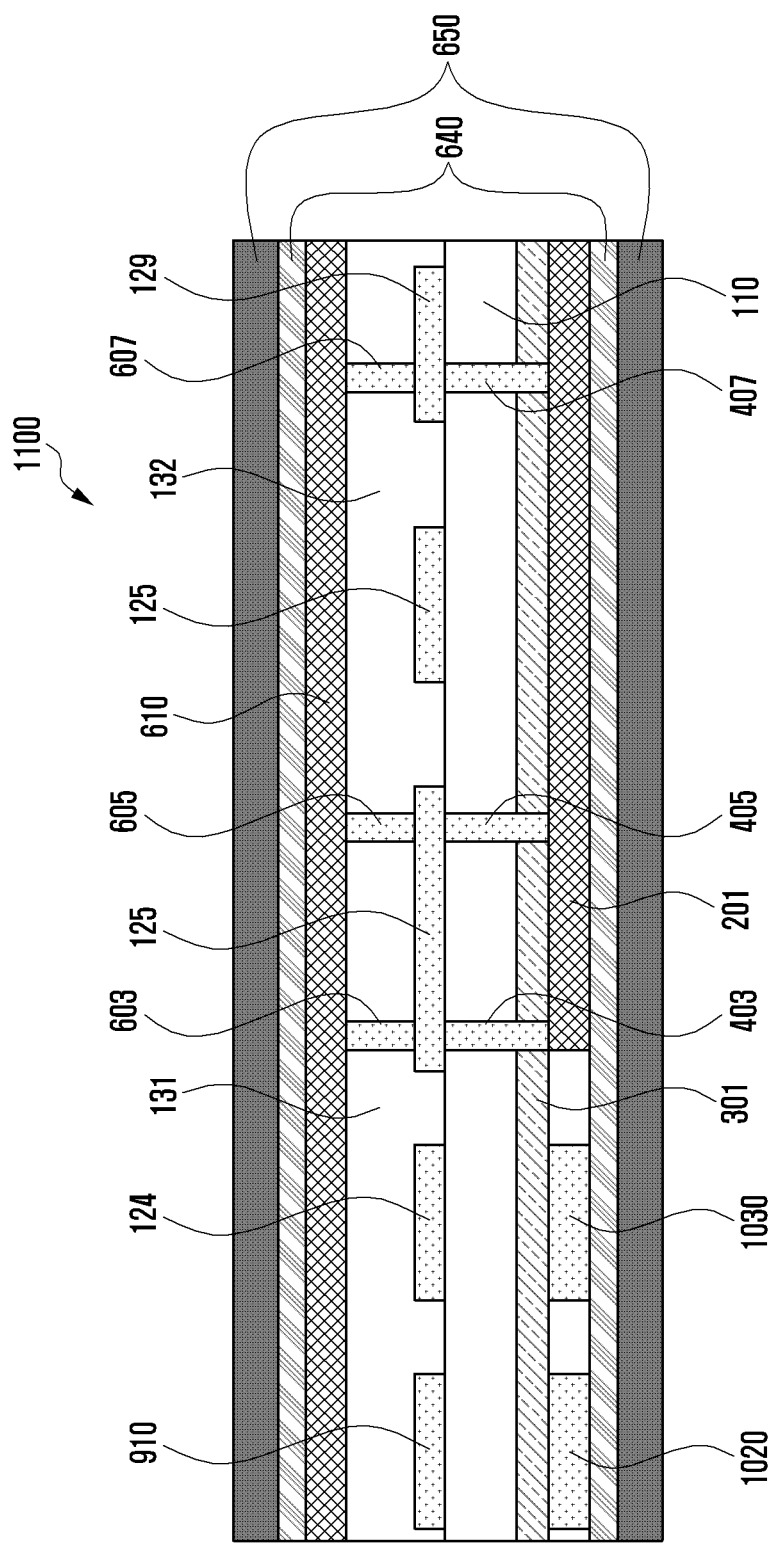
FIG. 11 is a cross-sectional view illustrating an example configuration of a flexible flat cable according to an example embodiment of the disclosure.

FIG. 11 is a cross-sectional view illustrating an example configuration of a flexible flat cable according to an example embodiment of the disclosure.

In a description of FIG. 11, a description of the same configuration and functions as those of the example embodiment of FIG. 6 and the example embodiment of FIG. 10 may not be repeated. In the example embodiment of FIG. 11, a description of the same configuration and functions as those of other embodiments may not be repeated.

According to an embodiment, a flexible flat cable 1100 of FIG. 11 may include the first insulation portion 110, the second ground portion 125, the third ground portion 129, the 1-2 signal transmission line 124, the second signal transmission line 126, the 2-1 insulation portion 131, the 2-2 insulation portion 132, the first mesh copper layer 201, the bonding sheet 301, the second via 403 to the fourth via 407, the six via 603 to the eighth via 607, the third signal line 1020, and the second power line 1030 described in the example embodiment of FIG. 6 and the example embodiment of FIG. 10 and have the same disposition structure.

According to an embodiment, in the flexible flat cable 1100, the first ground portion 121, the first via 401, and the fifth via 601 described in the example embodiment of FIG. 6 and the fourth ground portion 1010 described in the example embodiment of FIG. 10 may be omitted.

According to an embodiment, a first power line 910, the 1-2 signal transmission line 124, the second ground portion 125, the second signal transmission line 126, and the third ground portion 129 may be disposed at predetermined intervals on the first insulation portion 110.

According to an embodiment, the first mesh copper layer 201 and the bonding sheet 301 may be disposed between a lower surface of the first insulating portion 110 and the non-conductive adhesive layer 640 provided under the flexible flat cable 1100. The bonding sheet 301 may be disposed at a lower surface of the first insulation portion 110. The first mesh copper layer 201 may be adhered to a lower surface of the bonding sheet 301. The first mesh copper layer 201 may be at least partially removed from a lower surface of the bonding sheet 301. The first mesh copper layer 201 may be disposed only at a first side surface (e.g., the right side). For example, the first mesh copper layer 201 may be extended from the lower end of the second via 403 toward the fourth via 407. The first mesh copper layer 201 may not be disposed at a second side surface (e.g., the left side).

According to an example embodiment, the third signal line 1020 and the second power line 1030 may be disposed between the non-conductive adhesive layers 640 provided under the bonding sheet 301 and the flexible flat cable 1100, in which the first mesh copper layer 201 is not formed. By disposing the third signal line 1020 and the second power line 1030 in an area in which the first mesh copper layer 201 is not formed, the flexible flat cable 1100 according to the example embodiment of FIG. 11 may be compactly designed.

According to an embodiment, the second mesh copper layer 610 may be disposed at upper surfaces of the 2-1 insulation portion 131 and the 2-2 insulation portion 132. The second mesh copper layer 610 may be configured together with the first mesh copper layer 201 such that the flexible flat cable 1100 has flexibility.

According to an example embodiment, the non-conductive adhesive layer 640 provided in the flexible flat cable 1100 may be disposed at an upper surface of the second mesh copper layer 610. According to various embodiments, the non-conductive adhesive layer 640 provided in the flexible flat cable 1100 may be disposed at both side ends of the second mesh copper layer 610 and side surfaces of the 2-1 insulating portion 131 and the 2-2 insulating portion 132.

According to an embodiment, the fourth insulating portion 650 may be adhered to an outer surface of the non-conductive adhesive layer 640 provided in an upper portion or a lower portion of the flexible flat cable 1100. The fourth insulating portion 650 may be made of a material having an insulating property.

According to an example embodiment, because the first mesh copper layer 201 and the second mesh copper layer 610 are made of a conductive material, shielding efficiency of the flexible flat cable 1100 according to the example embodiment of FIG. 11 is maintained, and the non-conductive adhesive layer 640 and the fourth insulating portion 650 may be made of a non-conductive material.

Figure 12:
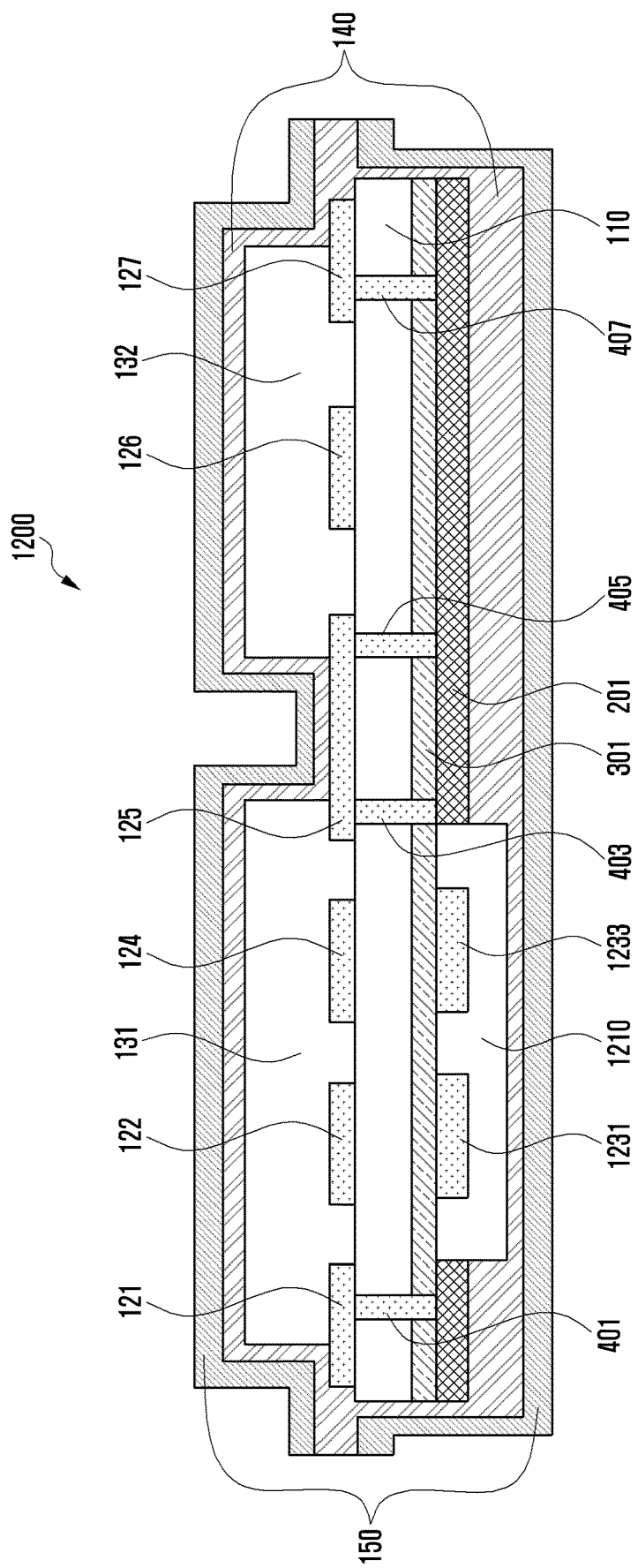
FIG. 12 is a cross-sectional view illustrating an example configuration of a flexible flat cable according to an example embodiment of the disclosure.

FIG. 12 is a cross-sectional view illustrating an example configuration of a flexible flat cable according to an example embodiment of the disclosure.

In a description of FIG. 12, a description of the same configuration and functions as those of the example embodiment of FIG. 4 and the example embodiment of FIG. 10 may not be repeated. In the example embodiment of FIG. 12, a description of the same configuration and functions as those of other embodiments may not be repeated.

According to an embodiment, a flexible flat cable 1200 of FIG. 12 may include the first insulating portion 110, the first ground portion 121, the second ground portion 125, the third ground portion 129, the 1-1 signal transmission line 122, the 1-2 signal transmission line 124, the second signal transmission line 126, the 2-1 insulation portion 131, the 2-2 insulation portion 132, the bonding sheet 301, the first mesh copper layer 201, the conductive adhesive layer 140, and the shielding portion 150 described in the example embodiment of FIG. 4 and the example embodiment of FIG. 10 and have the same disposition structure.

With reference to FIG. 12, a flexible flat cable 1200 according to the example embodiment of FIG. 12 of the disclosure may include a first mesh copper layer 201, bonding sheet 301, and first via 401 to fourth via 407.

According to an embodiment, the first mesh copper layer 201 and the bonding sheet 301 may be disposed between a lower surface of the first insulation portion 110 and the conductive adhesive layer 140. The first mesh copper layer 201 may be disposed beneath the bonding sheet 301. A lower surface of the first mesh copper layer 201 may be adhered to the conductive adhesive layer 140. An upper surface of the first mesh copper layer 201 may be adhered to a lower surface of the bonding sheet 301. An upper surface of the bonding sheet 301 may be adhered to the first insulation portion 110.

According to an embodiment, the first mesh copper layer 201 may be at least partially removed from a lower surface of the bonding sheet 301. The conductive adhesive layer 140 corresponding to the at least partially removed first mesh copper layer 201 may also be partially removed.

The first mesh copper layer 201 may be disposed only at a first side surface (e.g., the right side). For example, the first mesh copper layer 201 may be extended and disposed from the lower end of the second via 403 toward the fourth via 407.

According to an embodiment, a first power line 1231 and a second power line 1233 may be disposed at predetermined intervals in an area in which the first mesh copper layer 201 and the conductive adhesive layer 140 are partially removed. The first power line 1231 and the second power line 1233 may be adhered in a partial area of a lower surface of the bonding sheet 301. The first mesh copper layer 201 and the conductive adhesive layer 140 may be partially removed, and a third insulating portion 1210 may be formed in an area in which the first power line 1231 and the second power line 1233 are disposed.

Figure 13:
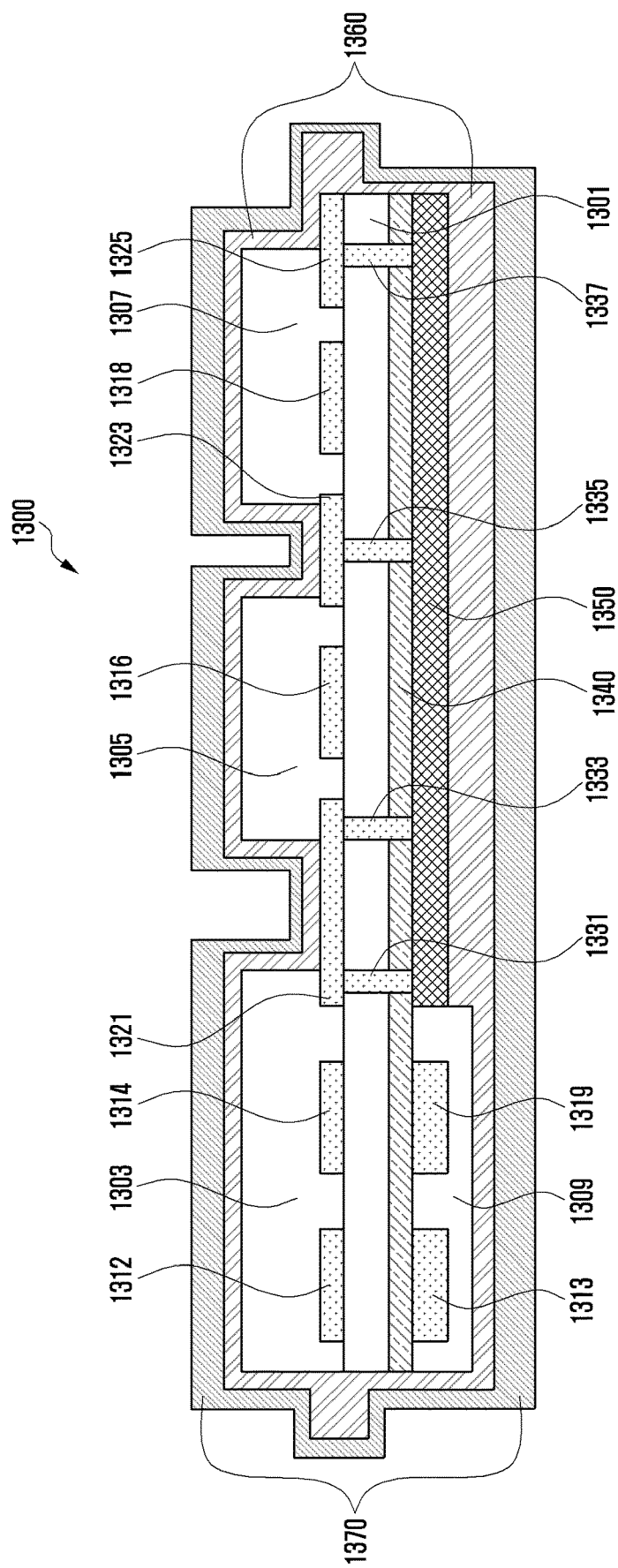
FIG. 13 is a cross-sectional view illustrating an example configuration of a flexible flat cable according to an example embodiment of the disclosure.

FIG. 13 is a cross-sectional view illustrating an example configuration of a flexible flat cable according to an example embodiment of the disclosure.

In a description of FIG. 13, a description of the same configuration and functions as those of the example embodiment of FIG. 1 to the example embodiment of FIG. 12 may not be repeated. In the example embodiment of FIG. 13, a description of the same configuration and functions as those of other embodiments may not be repeated.

With reference to FIG. 13, a flexible flat cable 1300 according to the example embodiment of FIG. 13 of the disclosure may include a first insulation portion 1301, second insulation portion 1303, third insulation portion 1305, fourth insulation portion 1307, fifth insulation portion 1309, first ground portion 1321, second ground portion 1323, third ground portion 1325, first power line 1312, second power line 1313, first signal transmission line 1314, second signal transmission line 1316, third signal transmission line 1318, fourth signal transmission line 1319, first via 1331 to fourth via 1337, bonding sheet 1340, mesh copper layer 1350, conductive adhesive layer 1360, and shielding portion 1370.

According to an example embodiment, the first insulating portion 1301 may be made of a material having an insulating property. The first insulating portion 1301 may be made of a dielectric material. The first insulating portion 1301 may include a copper clad laminate (CCL).

According to an embodiment, the first ground portion 1321, the second ground portion 1323, and the third ground portion 1325 may be disposed at predetermined intervals on the first insulation portion 1301. The first ground portion 1321, the second ground portion 1323, and the third ground portion 1325 may be made of a conductive metal (e.g., copper) in which a current may flow.

According to an embodiment, the first power line 1312, the first signal transmission line 1314, the second signal transmission line 1316, and the third signal transmission line 1318 may be disposed at a predetermined intervals on the first insulation portion 1301.

According to an embodiment, the first power line 1312 and the first signal transmission line 1314 may be disposed between at least a portion of the conductive adhesive layer 1360 and the first ground portion 1321. The second signal transmission line 1316 may be disposed between the first ground portion 1321 and the second ground portion 1323. The third signal transmission line 1318 may be disposed between the second ground portion 1323 and the third ground portion 1325. The first signal transmission line 1314, the second signal transmission line 1316, and the third signal transmission line 1318 may have different signal transmission frequency bands. The first signal transmission line 1314, the second signal transmission line 1316, and the third signal transmission line 1318 may transmit differential signals having different phases.

According to an embodiment, the second insulation portion 1303, the third insulation portion 1305, the fourth insulation portion 1307, and the fifth insulation portion 1309 may be made of a material having an insulating property. The second insulation portion 1303, the third insulation portion 1305, the fourth insulation portion 1307, and the fifth insulation portion 1309 may include a cover layer.

According to an embodiment, the second insulation portion 1303 may be disposed on at least a portion of the first power line 1312, the first signal transmission line 1314, and the first ground portion 1321. The third insulation portion 1305 may be disposed on at least a portion of the first ground portion 1321 and at least a portion of the second signal transmission line 1316 and the second ground portion 1323. The fourth insulation portion 1307 may be disposed on at least a portion of the second ground portion 1323 and at least a portion of the third signal transmission line 1318 and the third ground portion 1325.

According to an embodiment, the conductive adhesive layer 1360 may enclose the first insulating portion 1301, the second insulating portion 1303, the third insulating portion 1305, the fourth insulating portion 1307, and the fourth insulating portion 1309. The conductive adhesive layer 1360 may be electrically connected to the first ground portion 1321, the second ground portion 1323, and the third ground portion 1325.

According to an embodiment, the shielding portion 1370 may be adhered to the outside of the conductive adhesive layer 1360 to perform a shielding function.

According to an embodiment, the bonding sheet 1340 may be adhered to a lower surface of the first insulating portion 1301. The mesh copper layer 1350 may be disposed in at least a portion of a lower surface of the bonding sheet 1340. The bonding sheet 1340 and the mesh copper layer 1350 may be disposed between a lower surface of the first insulating portion 1301 and the conductive adhesive layer 1360. A lower surface of the mesh copper layer 1350 may be attached to the conductive adhesive layer 1360. An upper surface of the mesh copper layer 1350 may be attached to a lower surface of the bonding sheet 1340. An upper surface of the bonding sheet 1340 may be adhered to the first insulating portion 1301.

According to an embodiment, the first via 1331 to the fourth via 1337 (e.g., 1331, 1333, 1335, 1337) may have a structure capable of conducting heterogeneous metals. The first via 1331 to the fourth via 1337 may include plating, sputtering, via hole plating, or the like.

According to an embodiment, by penetrating the first insulating portion 1301 and the bonding sheet 1340, the first via 1331 may electrically connect the first end of the first ground portion 1321 and the mesh copper layer 1350. By penetrating the first insulating portion 1301 and the bonding sheet 1340, the second via 1333 may electrically connect the second end of the first ground portion 1321 and the mesh copper layer 1350. By penetrating the first insulating portion 1301 and the bonding sheet 1340, the third via 1335 may electrically connect the second ground portion 1323 and the mesh copper layer 1350. By penetrating the first insulating portion 1301 and the bonding sheet 1340, the fourth via 1337 may electrically connect the third ground portion 1325 and the mesh copper layer 1350.

According to an embodiment, the first via 1331 to the fourth via 1337 may connect the first ground portion 1321, the second ground portion 1323, and the third ground portion 1325, and the mesh copper layer 1350, thereby strengthening a ground function.

According to an embodiment, the mesh copper layer 1350 may be at least partially removed from a lower surface of the bonding sheet 1340. The conductive adhesive layer 1360 corresponding to the at least partially removed mesh copper layer 1350 may also be partially removed. The mesh copper layer 1350 may be disposed only in at least a portion of a first side surface (e.g., the right side). For example, the mesh copper layer 1350 may be disposed from the lower end of the first via 1331 to the conductive adhesive layer 1360 toward the fourth via 1337.

In an embodiment, the second power line 1313 and the fourth signal transmission line 1319 may be disposed at predetermined intervals in an area in which the mesh copper layer 1350 and the conductive adhesive layer 1360 are partially removed. The second power line 1313 and the fourth signal transmission line 1319 may be adhered to a partial area of a lower surface of the bonding sheet 1340. The mesh copper layer 1350 and the conductive adhesive layer 1360 may be partially removed, and the fifth insulation portion 1309 may be formed in an area in which the second power line 1313 and the fourth signal transmission line 1319 are disposed.

Figure 14:
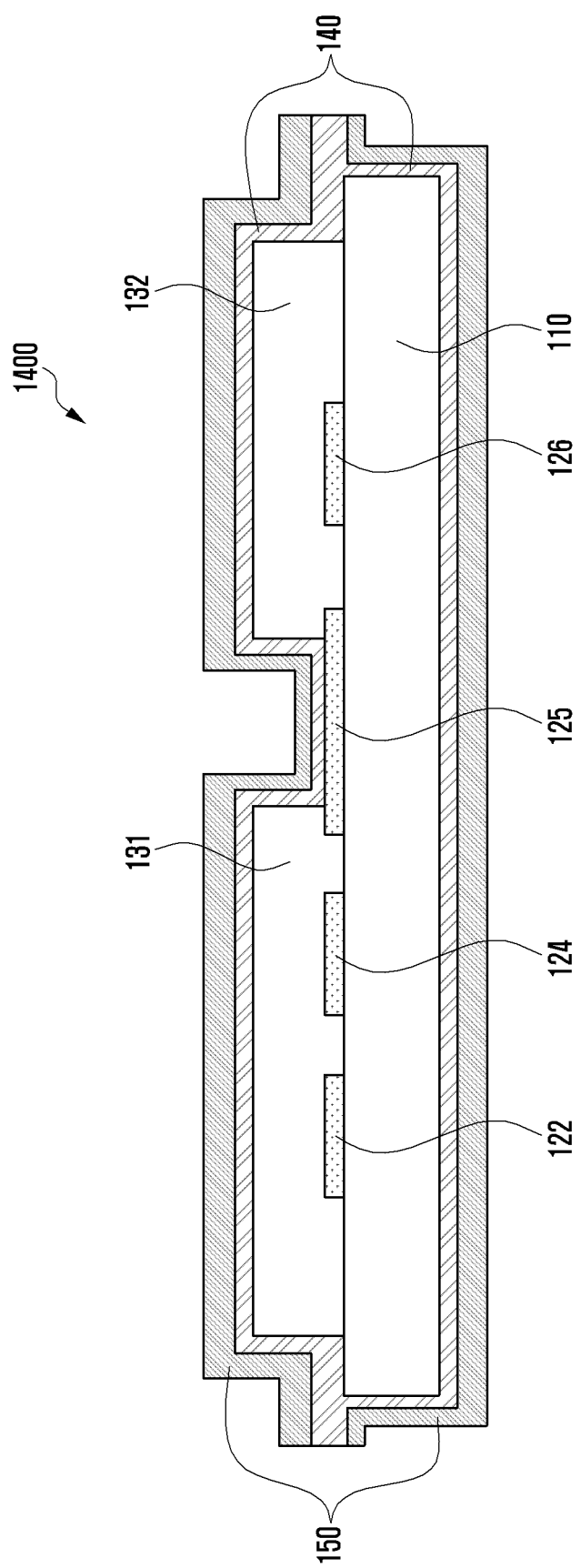
FIG. 14 is a cross-sectional view illustrating an example configuration of a flexible flat cable according to an example embodiment of the disclosure.

FIG. 14 is a cross-sectional view illustrating an example configuration of a flexible flat cable according to an example embodiment of the disclosure.

In a description of FIG. 14, a description of the same configuration and functions as those of the example embodiment of FIG. 1 may not be repeated. In the example embodiment of FIG. 14, a description of the same configuration and functions as those of other embodiments may not be repeated.

With reference to FIG. 14, a flexible flat cable 1400 according to the example embodiment of FIG. 14 of the disclosure may include the first insulation portion 110, the second ground portion 125, the 1-1 signal transmission line 122, the 1-2 signal transmission line 124, the second signal transmission line 126, the 2-1 insulation portion 131, the 2-2 insulation portion 132, the conductive adhesive layer 140, and the shielding portion 150 described in the example embodiment of FIG. 1 and have the same disposition structure.

According to an example embodiment, in the flexible flat cable 1400 according to the example embodiment of FIG. 14 of the disclosure, the description of the first ground portion 121 and the third ground portion 129 described in the example embodiment of FIG. 1 may not be repeated.

According to various embodiments, the 1-1 signal transmission line 122, the 1-2 signal transmission line 124, the second ground portion 125, and the second signal transmission line 126 may be disposed at predetermined intervals on the first insulation portion 110. At least one power line (not illustrated) may be disposed at a first side surface (e.g., the left side) based on the second ground portion 125. At least one power line (not illustrated) may be disposed at a second side surface (e.g., the right side) based on the second ground portion 125.

According to various embodiments, the 2-1 insulation portion 131 may be stacked on at least a portion of the 1-1 signal transmission line 122, the 1-2 signal transmission line 124, and the second ground portion 125. The 2-2 insulation portion 132 may be stacked on at least a portion of the second ground portion 125 and the second signal transmission line 126.

According to various embodiments, the conductive adhesive layer 140 may enclose the first insulation portion 110, the 2-1 insulation portion 131, and the 2-2 insulation portion 132. The conductive adhesive layer 140 may be electrically connected to the second ground portion 125. The conductive adhesive layer 140 may shield the 1-1 signal transmission line 122, the 1-2 signal transmission line 124, and the second signal transmission line 126 while enclosing the first insulation portion 110, the 2-1 insulation portion 131, and the 2-2 insulation portion 132.

According to various embodiments, the shielding portion 150 may be adhered to the outside of the conductive adhesive layer 140 to perform a shielding function.

Figure 15:
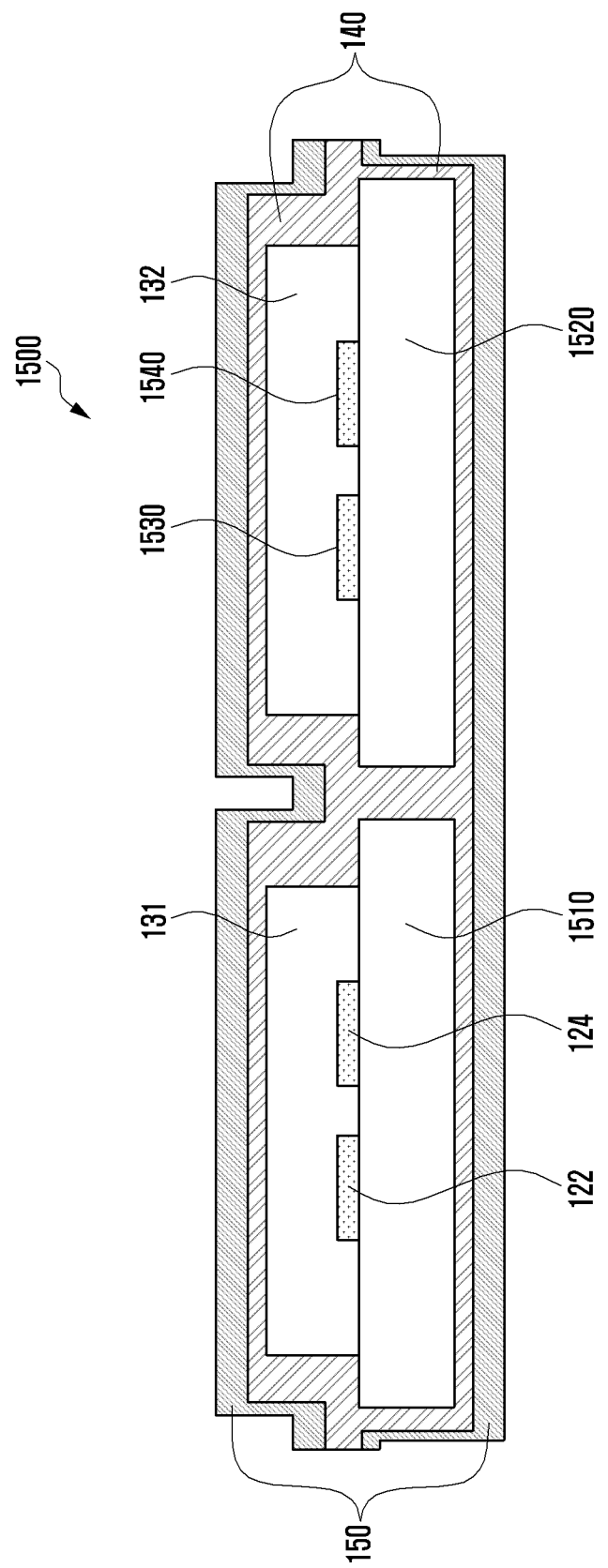
FIG. 15 is a cross-sectional view illustrating an example configuration of a flexible flat cable according to an example embodiment of the disclosure.

FIG. 15 is a cross-sectional view illustrating an example configuration of a flexible flat cable according to an example embodiment of the disclosure.

In a description of FIG. 15, a description of the same configuration and functions as those of the example embodiment of FIG. 1 and the example embodiment of FIG. 14 may not be repeated. In the example embodiment of FIG. 15, a description of the same configuration and functions as those of other embodiments may not be repeated.

With reference to FIG. 15, a flexible flat cable 1500 according to an example embodiment of the disclosure may include a 1-1 insulation portion 1510, 1-2 insulation portion 1520, 1-1 signal transmission line 122, 1-2 signal transmission line 124, 2-1 signal transmission line 1530, 2-2 signal transmission line 1540, 2-1 insulation portion 131, 2-2 insulation portion 132, conductive adhesive layer 140, and shielding portion 150.

According to an example embodiment, the 1-1 insulation portion 1510 and the 1-2 insulation portion 1520 may be made of a material having an insulating property. The 1-1 insulation portion 1510 and the 1-2 insulation portion 1520 may be made of a dielectric material. The 1-1 insulation portion 1510 and the 1-2 insulation portion 1520 may include a copper clad laminate (CCL).

According to an embodiment, the 1-1 signal transmission line 122 and the 1-2 signal transmission line 124 may be disposed at predetermined intervals on the 1-1 insulation portion 1510. The 1-1 signal transmission line 122 and the 1-2 signal transmission line 124 may be made of a conductive metal (e.g., copper) in which a current may flow. The 1-1 signal transmission line 122 and the 1-2 signal transmission line 124 may include strip lines in which communication signals may be transmitted and received.

According to an embodiment, the 2-1 signal transmission line 1530 and the 2-2 signal transmission line 1540 may be disposed at predetermined intervals on the 1-2 insulation portion 1520. The 2-1 signal transmission line 1530 and the 2-2 signal transmission line 1540 may be made of a conductive metal (e.g., copper) in which a current may flow. The 2-1 signal transmission line 1530 and the 2-2 signal transmission line 1540 may include strip lines in which communication signals may be transmitted and received.

According to various embodiments, the 1-1 signal transmission line 122 and the 1-2 signal transmission line 124 may be used for transmission of a low speed signal. For example, the low speed signal may include at least one of an audio signal, a power signal, and a control signal. The 2-1 signal transmission line 1530 and the 2-2 signal transmission line 1540 may be used for transmission of a high speed signal. For example, the high speed signal may include at least one of a 5G communication signal, a Wi-Fi signal, or an intermediate frequency (IF) signal.

According to various embodiments, the 1-1 signal transmission line 122 and the 1-2 signal transmission line 124 may transmit differential signals having different phases. The 1-1 signal transmission line 122 and the 1-2 signal transmission line 124 may reduce an influence of interference or noise between signals.

According to various embodiments, the 2-1 signal transmission line 1530 and the 2-2 signal transmission line 1540 may transmit differential signals having different phases. The 2-1 signal transmission line 1530 and the 2-2 signal transmission line 1540 may reduce an influence of interference or noise between signals.

According to an embodiment, the 2-1 insulation portion 131 and the 2-2 insulation portion 132 may be made of a material having an insulating property. The 2-1 insulation portion 131 and the 2-2 insulation portion 132 may be made of a dielectric material. The 2-1 insulation portion 131 and the 2-2 insulation portion 132 may include a cover layer.

According to various embodiments, the 2-1 insulation portion 131 may be stacked on the 1-1 signal transmission line 122 and the 1-2 signal transmission line 124. The 2-2 insulation portion 132 may be stacked on the 2-1 signal transmission line 1530 and the 2-2 signal transmission line 1540.

According to various embodiments, the 1-1 insulation portion 1510 and the 1-2 insulation portion 1520 may be spaced apart from each other. The 2-1 insulation portion 131 and the 2-2 insulation portion 132 may be spaced apart from each other.

According to an example embodiment, the conductive adhesive layer 140 may be made of a conductive material. The conductive adhesive layer 140 may include metal powder in a dielectric material to represent a property in which conductivity is available with anisotropy or isotropy.

According to various embodiments, the conductive adhesive layer 140 may enclose a 1-1 insulation portion 1510, 1-2 insulation portion 1520, 2-1 insulation portion 131, and 2-2 insulation portion 132. The conductive adhesive layer 140 may be disposed between the 1-1 insulation portion 1510 and the 1-2 insulation portion 1520. The conductive adhesive layer 140 may be disposed between the 2-1 insulation portion 131 and the 2-2 insulation portion 132.

According to various embodiments, the conductive adhesive layer 140 may shield the 1-1 signal transmission line 122, the 1-2 signal transmission line 124, the 2-1 signal transmission line 1530, and the 2-2 signal transmission line 1540 while enclosing the 1-1 insulation portion 1510, the 1-2 insulation portion 1520, the 2-1 insulation portion 131, and the 2-2 insulation portion 132, thereby preventing and/or reducing crosstalk occurring between signals received in the 1-1 signal transmission line 122, the 1-2 signal transmission line 124, the 2-1 signal transmission line 1530, and the 2-2 signal transmission line 1540 and signals transmitted to the outside.

According to an embodiment, the shielding portion 150 may be made of a conductive material. The shielding portion 150 may include an electromagnetic interference (EMI) film. The shielding portion 150 may be formed using a metal sputtering method. The shielding portion 150 may prevent and/or reduce electromagnetic waves from being exposed to the outside of the flexible flat cable 1500. The shielding portion 150 may be adhered to the outside of the conductive adhesive layer 140 to perform a shielding function.

Figure 16:
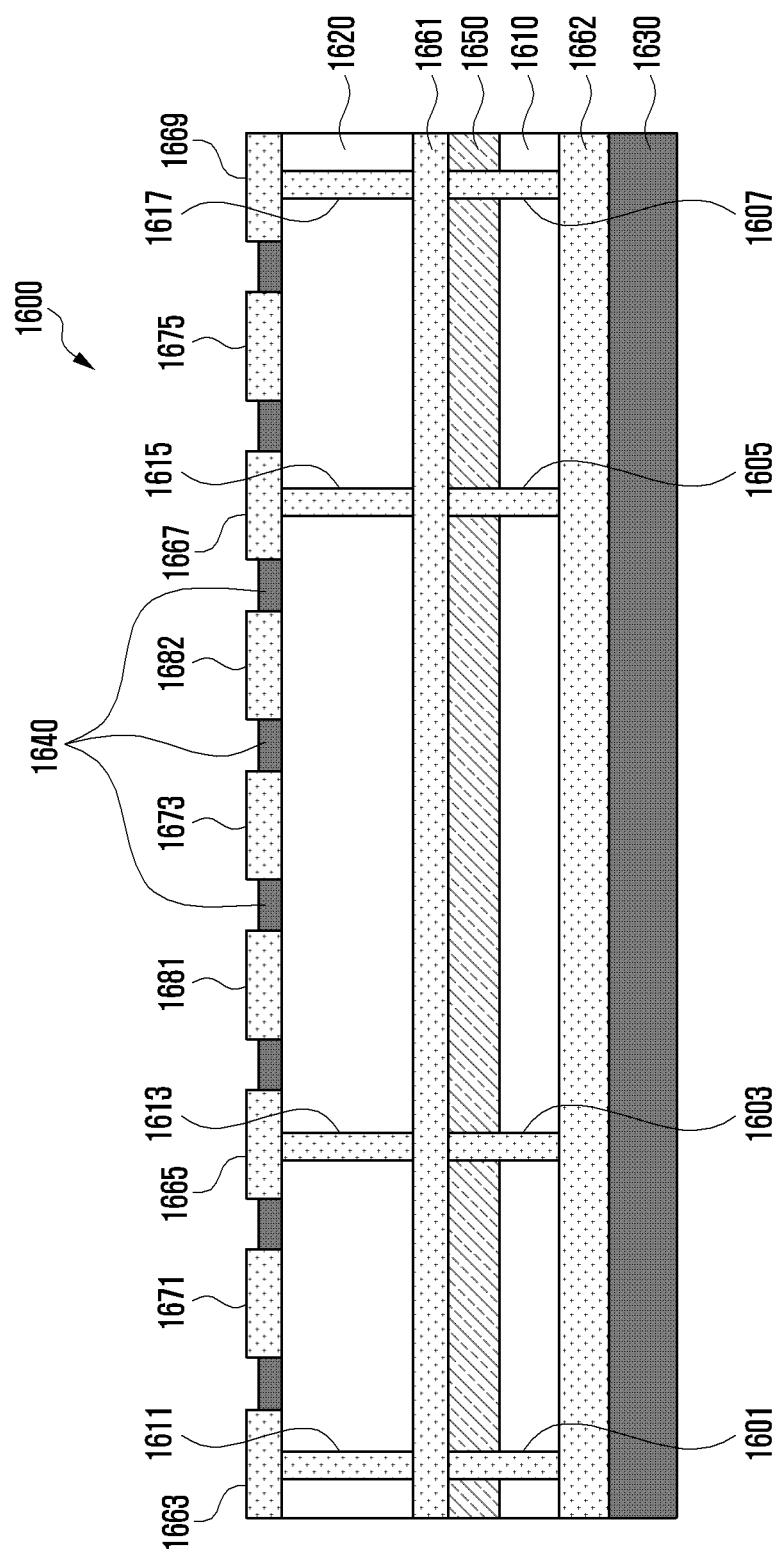
FIG. 16 is a cross-sectional view illustrating an example configuration of a flexible flat cable according to an example embodiment of the disclosure.

FIG. 16 is a cross-sectional view illustrating an example configuration of a flexible flat cable according to an example embodiment of the disclosure.

In a description of FIG. 16, a description of the same configuration and functions as those of the example embodiment of FIG. 6 may not be repeated. In the example embodiment of FIG. 16, a description of the same configuration and functions as those of other embodiments may not be repeated.

With reference to FIG. 16, a flexible flat cable 1600 according to an example embodiment of the disclosure may include a first insulation portion 1610, second insulation portion 1620, third insulation portion 1630, fourth insulation portion 1640, bonding sheet 1650, first ground portion 1661, second ground portion 1662, 3-1 ground portion 1663, 3-2 ground portion 1665, 3-3 ground portion 1667, 3-4 ground portion 1669, first via 1601 to eighth via 1617 (e.g., 1601, 1603, 1605, 1607, 1611, 1613, 1615, 1617), first signal transmission line 1671, second signal transmission line 1673, third signal transmission line 1675, first power line 1681, and second power line 1682.

According to an embodiment, the bonding sheet 1650 and a first ground portion 1661 may be disposed between the first insulation portion 1610 and the second insulation portion 1620.

According to various embodiments, the bonding sheet 1650 may be disposed on the first insulating portion 1610. The first ground portion 1661 and the second insulation portion 1620 may be disposed over the bonding sheet 1650. The first ground portion 1661 may be disposed under the second insulation portion 1620.

According to an embodiment, the second ground portion 1662 may be disposed beneath the first insulation portion 1610. The third insulating portion 1630 may be disposed beneath the second ground portion 1662. According to various embodiments, the third insulation portion 1630 may include a photo solder resist film or an insulation ink.

According to an embodiment, the 3-1 ground portion 1663, the first signal transmission line 1671, the 3-2 ground portion 1665, the first power line 1681, the second signal transmission line 1673, the second power line 1682, the 3-3 ground portion 1667, the third signal transmission line 1675, and the 3-4 ground portion 1669 may be disposed at predetermined intervals on the second insulation portion 1620.

According to an embodiment, parts of the fourth insulation portion 1640 may be disposed between the 3-1 ground portion 1663, the first signal transmission line 1671, the 3-2 ground portion 1665, the first power line 1681, the second signal transmission line 1673, the second power line 1682, the 3-3 ground portion 1667, the third signal transmission line 1675, and the 3-4 ground portion 1669. According to various embodiments, the fourth insulation portion 1640 may include a photo solder resist film or an insulation ink.

According to an example embodiment, by penetrating the first insulating portion 1610 and the bonding sheet 1650, the first via 1601 may electrically connect the first ground portion 1661 and the second ground portion 1662. By penetrating the first insulating portion 1610 and the bonding sheet 1650, the second via 1603 may electrically connect the first ground portion 1661 and the second ground portion 1662. By penetrating the first insulating portion 1610 and the bonding sheet 1650, the third via 1605 may electrically connect the first ground portion 1661 and the second ground portion 1662. By penetrating the first insulating portion 1610 and the bonding sheet 1650, the fourth via 1607 may electrically connect the first ground portion 1661 and the second ground portion 1662. According to various embodiments, the first via 1601, the second via 1603, the third via 1605, and the fourth via 1607 may be disposed at predetermined intervals.

According to an example embodiment, the fifth via 1611, the sixth via 1613, the seventh via 1615, and the eighth via 1617 may penetrate the second insulation portion 1620 and be disposed to correspond to the first via 1601, the second via 1603, the third via 1605, and the fourth via 1607 on a vertical axis.

According to various embodiments, by penetrating the second insulating portion 1620, the fifth via 1611 may electrically connect the first ground portion 1661 and the 3-1 ground portion 1663. By penetrating the second insulation portion 1620, the sixth via 1613 may electrically connect the first ground portion 1661 and the 3-2 ground portion 1665. By penetrating the second insulation portion 1620, the seventh via 1615 may electrically connect the first ground portion 1661 and the 3-3 ground portion 1667. By penetrating the second insulation portion 1620, the eighth via 1617 may electrically connect the first ground portion 1661 and the 3-4 ground portion 1669. According to various embodiments, the fifth via 1611, the sixth via 1613, the seventh via 1615, and the eighth via 1617 may be disposed at predetermined intervals.

According to various embodiments of the disclosure, the flexible flat cable 1600 according to the example embodiment of FIG. 16 of the disclosure may be configured so that a connector (not illustrated) is connected to the 3-1 ground portion 1663, the first signal transmission line 1671, the 3-2 ground portion 1665, the first power line 1681, the second signal transmission line 1673, the second power line 1682, the 3-3 ground portion 1667, the third signal transmission line 1675, and the 3-4 ground portion 1669 disposed at predetermined intervals on the second insulation portion 1620.

Figure 17:
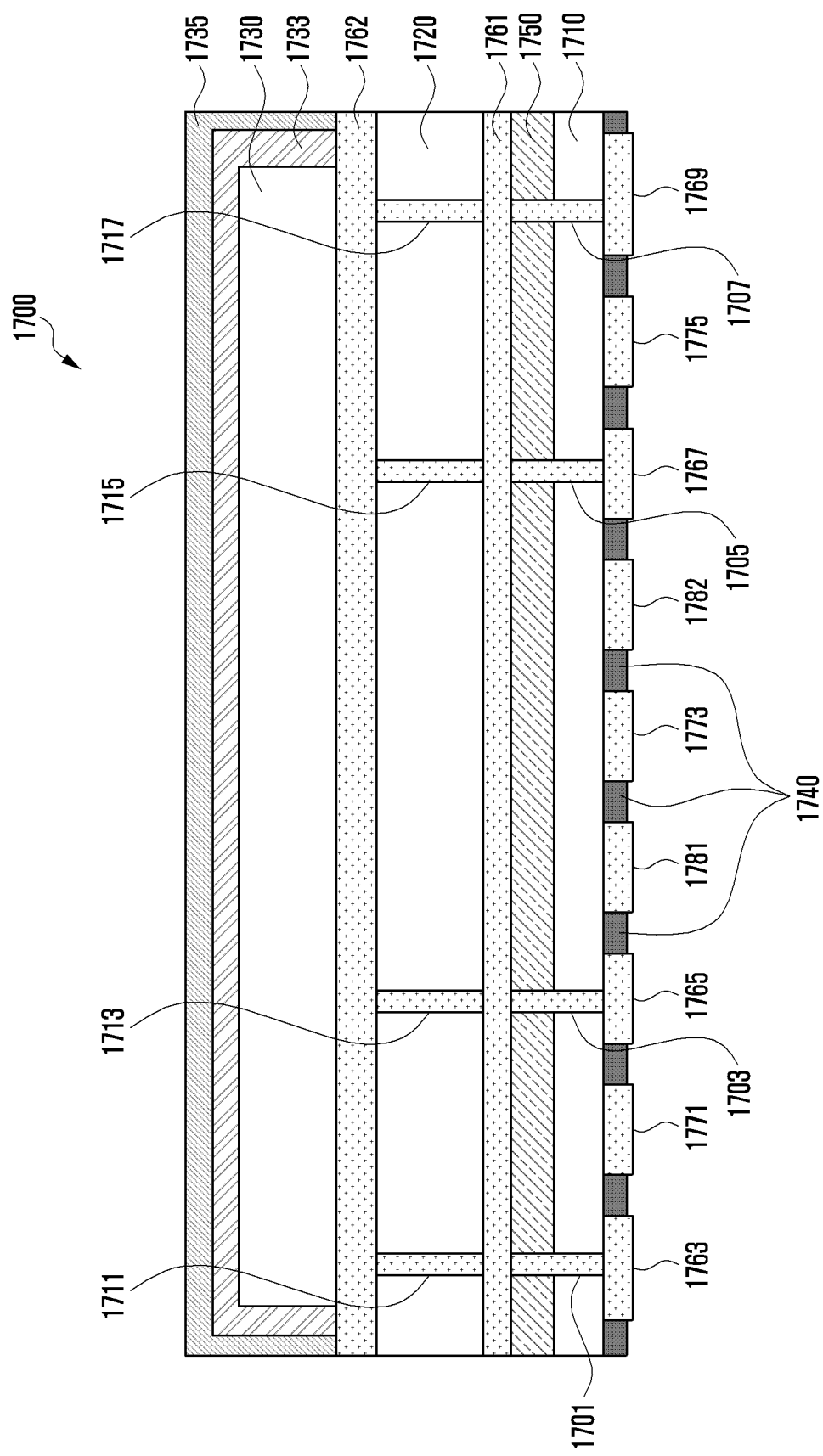
FIG. 17 is a cross-sectional view illustrating an example configuration of a flexible flat cable according to an example embodiment of the disclosure.

FIG. 17 is a cross-sectional view illustrating an example configuration of a flexible flat cable according to an example embodiment of the disclosure.

In a description of FIG. 17, a description of the same configuration and functions as those of the example embodiment of FIG. 6 and the example embodiment of FIG. 16 may not be repeated. In the example embodiment of FIG. 17, a description of the same configuration and functions as those of other embodiments may not be repeated.

With reference to FIG. 17, a flexible flat cable 1700 according to the example embodiment of FIG. 17 of the disclosure may include a first insulation portion 1710, second insulation portion 1720, third insulation portion 1730, fourth insulation portion 1740, conductive adhesive layer 1733, shielding portion 1735, bonding sheet 1750, first ground portion 1761, second ground portion 1762, 3-1 ground portion 1763, 3-2 ground portion 1765, 3-3 ground portion 1767, 3-4 ground portion 1769, first via 1701 to eighth via 1717 (e.g., 1701, 1703, 1705, 1707, 1711, 1713, 1715, 1717), first signal transmission line 1771, second signal transmission line 1773, third signal transmission line 1775, first power line 1781, and second power line 1782.

According to an embodiment, the bonding sheet 1750 and the first ground portion 1761 may be disposed between the first insulation portion 1710 and the second insulation portion 1720.

According to various embodiments, the bonding sheet 1750 may be disposed on the first insulating portion 1710. The first ground portion 1761 and the second insulation portion 1720 may be disposed on the bonding sheet 1750. The first ground portion 1761 may be disposed beneath the second insulation portion 1720.

According to an embodiment, the second ground portion 1762 may be disposed on the second insulation portion 1720. The third insulation portion 1730 may be disposed on the second ground portion 1762.

According to an embodiment, the conductive adhesive layer 1733 may enclose the third insulating portion 1730. The first end (e.g., left end) and the second end (e.g., right end) of the conductive adhesive layer 1733 may be electrically connected to the second ground portion 1762.

According to an embodiment, the shielding portion 1735 may be adhered to the outside of the conductive adhesive layer 1733 to perform a shielding function. The first end (e.g., left end) and the second end (e.g., right end) of the shielding portion 1735 may be connected to the second ground portion 1762.

According to an embodiment, the 3-1 ground portion 1763, the first signal transmission line 1771, the 3-2 ground portion 1765, the first power line 1781, the second signal transmission line 1773, the second power line 1782, the 3-3 ground portion 1767, the third signal transmission line 1775, and the 3-4 ground portion 1769 may be disposed at predetermined intervals beneath the first insulation portion 1710.

According to an embodiment, parts of the fourth insulation portion 1740 may be disposed between the 3-1 ground portion 1763, the first signal transmission line 1771, the 3-2 ground portion 1765, the first power line 1781, the second signal transmission line 1773, the second power line 1782, the 3-3 ground portion 1767, the third signal transmission line 1775, and the 3-4 ground portion 1769. According to various embodiments, the fourth insulating portion 1740 may include a photo solder resist film or an insulating ink.

According to an embodiment, by penetrating the first insulating portion 1710 and the bonding sheet 1750, the first via 1701 may electrically connect the first ground portion 1761 and the 3-1 ground portion 1763. By penetrating the first insulating portion 1710 and the bonding sheet 1750, the second via 1703 may electrically connect the first ground portion 1761 and the 3-2 ground portion 1765. By penetrating the first insulating portion 1710 and the bonding sheet 1750, the third via 1705 may electrically connect the first ground portion 1761 and the 3-3 ground portion 1767. By penetrating the first insulating portion 1710 and the bonding sheet 1750, the fourth via 1707 may electrically connect the first ground portion 1761 and the 3-4 ground portion 1769. According to various embodiments, the first via 1701, the second via 1703, the third via 1705, and the fourth via 1707 may be disposed at predetermined intervals.

According to an example embodiment, the fifth via 1711, the sixth via 1713, the seventh via 1715, and the eighth via 1717 may penetrate the second insulation portion 1720 and be disposed to correspond to the first via 1701, the second via 1703, the third via 1705, and the fourth via 1707 on a vertical axis.

According to various embodiments, by penetrating the second insulating portion 1720, the fifth via 1711 may electrically connect the first ground portion 1761 and the second ground portion 1762. By penetrating the second insulating portion 1720, the sixth via 1713 may electrically connect the first ground portion 1761 and the second ground portion 1762. By penetrating the second insulating portion 1720, the seventh via 1715 may electrically connect the first ground portion 1761 and the second ground portion 1762. By penetrating the second insulation portion 1720, the eighth via 1717 may electrically connect the first ground portion 1761 and the second ground portion 1762. According to various embodiments, the fifth via 1711, the sixth via 1713, the seventh via 1715, and the eighth via 1717 may be disposed at predetermined intervals.

According to various embodiments, a flexible flat cable 1700 according to the example embodiment of FIG. 17 of the disclosure may be configured so that a connector (not illustrated) is connected to the 3-1 ground portion 1763, the first signal transmission line 1771, the 3-2 ground portion 1765, the first power line 1781, the second signal transmission line 1773, the second power line 1782, the 3-3 ground portion 1767, the third signal transmission line 1775, and the 3-4 ground portion 1769 disposed at predetermined intervals beneath the first insulation portion 1710.

Figure 18:
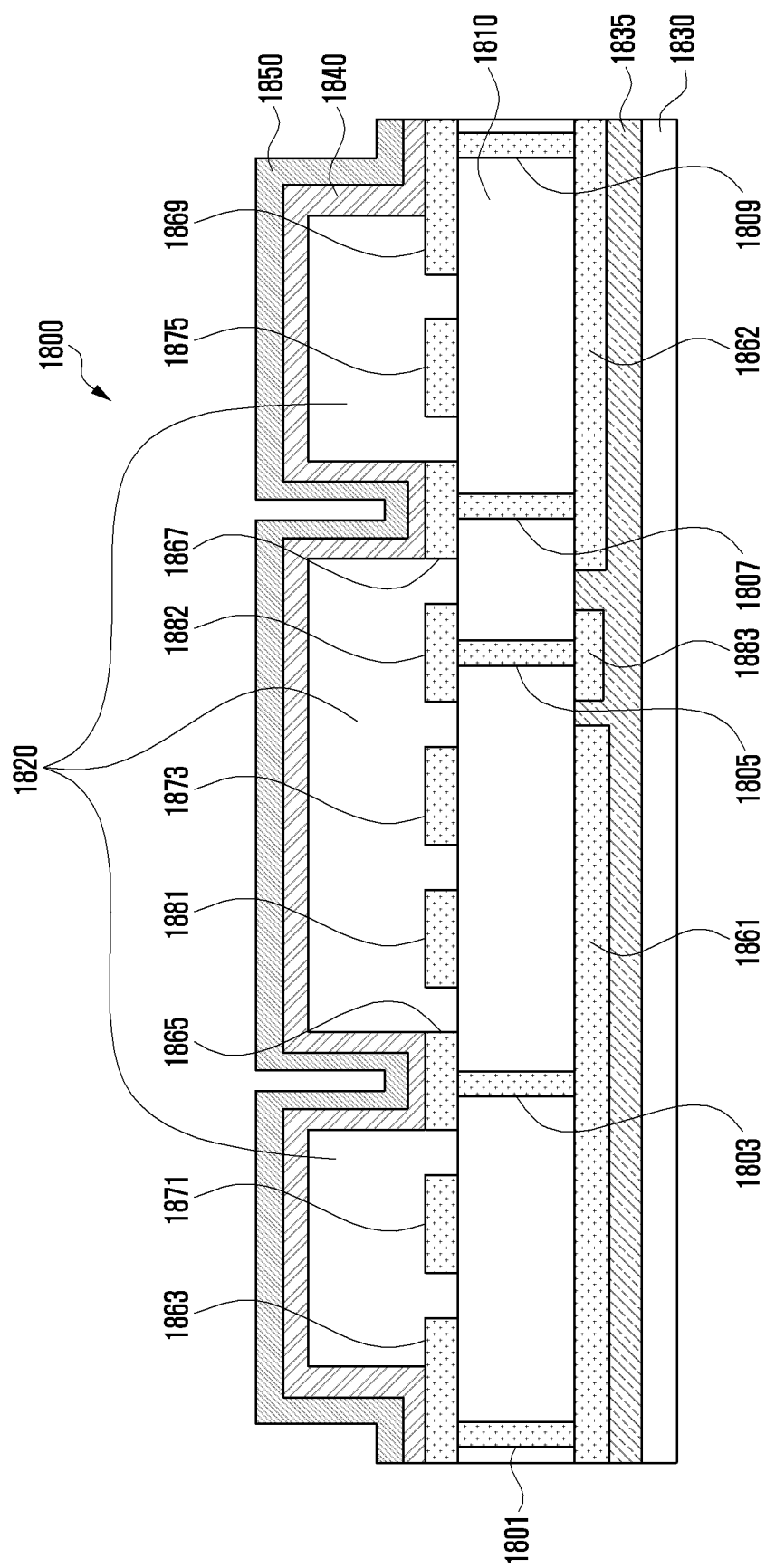
FIG. 18 is a cross-sectional view illustrating an example configuration of a flexible flat cable according to an example embodiment of the disclosure.

FIG. 18 is a cross-sectional view illustrating an example configuration of a flexible flat cable according to an example embodiment of the disclosure.

In a description of FIG. 18, a description of the same configuration and functions as those of the example embodiment of FIG. 16 and the example embodiment of FIG. 17 may not be repeated. In the example embodiment of FIG. 18, a description of the same configuration and functions as those of other embodiments may not be repeated.

With reference to FIG. 18, a flexible flat cable 1800 according to the example embodiment of FIG. 18 of the disclosure may include a first insulating portion 1810, second insulating portion 1820, third insulating portion 1830, non-conductive adhesive layer 1835, conductive adhesive layer 1840, shielding portion 1850, first ground portion 1861, second ground portion 1862, 3-1 ground portion 1863, 3-2 ground portion 1865, 3-3 ground portion 1867, 3-4 ground portion 1869, first via 1801 to fifth via 1809, first signal transmission line 1871, second signal transmission line 1873, third signal transmission line 1875, first power line 1881, second power line 1882, and third power line 1883.

According to an embodiment, the 3-1 ground portion 1863, the first signal transmission line 1871, the 3-2 ground portion 1865, the first power line 1881, the second signal transmission line 1873, the second power line 1882, the 3-3 ground portion 1867, the third signal transmission line 1875, and the 3-4 ground portion 1869 may be disposed at predetermined intervals on the first insulation portion 1810.

According to an embodiment, the second insulation portion 1820 may be disposed on the first insulation portion 1810. The second insulation portion 1820 may enclose and insulate at least a portion of the 3-1 ground portion 1863, the first signal transmission line 1871, the 3-2 ground portion 1865, the first power line 1881, the second signal transmission line 1873, the second power line 1882, the 3-3 ground portion 1867, the third signal transmission line 1875, and the 3-4 ground portion 1869 disposed at predetermined intervals on the first insulation portion 1810.

According to an embodiment, the conductive adhesive layer 1840 may enclose at least a portion of the second insulating portion 1820. The first end (e.g., the left end) of the conductive adhesive layer 1840 may be electrically connected to the 3-1 ground portion 1863. The second end (e.g., right end) of the conductive adhesive layer 1840 may be electrically connected to the 3-4 ground portion 1869. At least a portion of the conductive adhesive layer 1840 may be electrically connected to the 3-2 ground portion 1865 and the 3-3 ground portion 1867.

According to an embodiment, the shielding portion 1850 may be adhered to the outside of the conductive adhesive layer 1840 to perform a shielding function.

According to an embodiment, the first ground portion 1861, the third power line 1883, and the second ground portion 1862 may be disposed at predetermined intervals beneath the first insulation portion 1810.

According to an embodiment, the non-conductive adhesive layer 1835 may enclose the first ground portion 1861, the third power line 1883, and the second ground portion 1862 disposed at the predetermined intervals. The third insulating portion 1830 may be disposed beneath the non-conductive adhesive layer 1835.

According to an embodiment, by penetrating the first insulating portion 1810, the first via 1801 may electrically connect the first ground portion 1861 and the 3-1 ground portion 1863. By penetrating the first insulating portion 1810, the second via 1803 may electrically connect the first ground portion 1861 and the 3-2 ground portion 1865. By penetrating the first insulation portion 1810, the third via 1805 may electrically connect the second power line 1882 and the third power line 1883. By penetrating the first insulating portion 1810, the fourth via 1807 may electrically connect the second ground portion 1862 and the 3-3 ground portion 1867. By penetrating the first insulating portion 1810, the fifth via 1809 may electrically connect the second ground portion 1862 and the 3-4 ground portion 1869.

Figure 19:
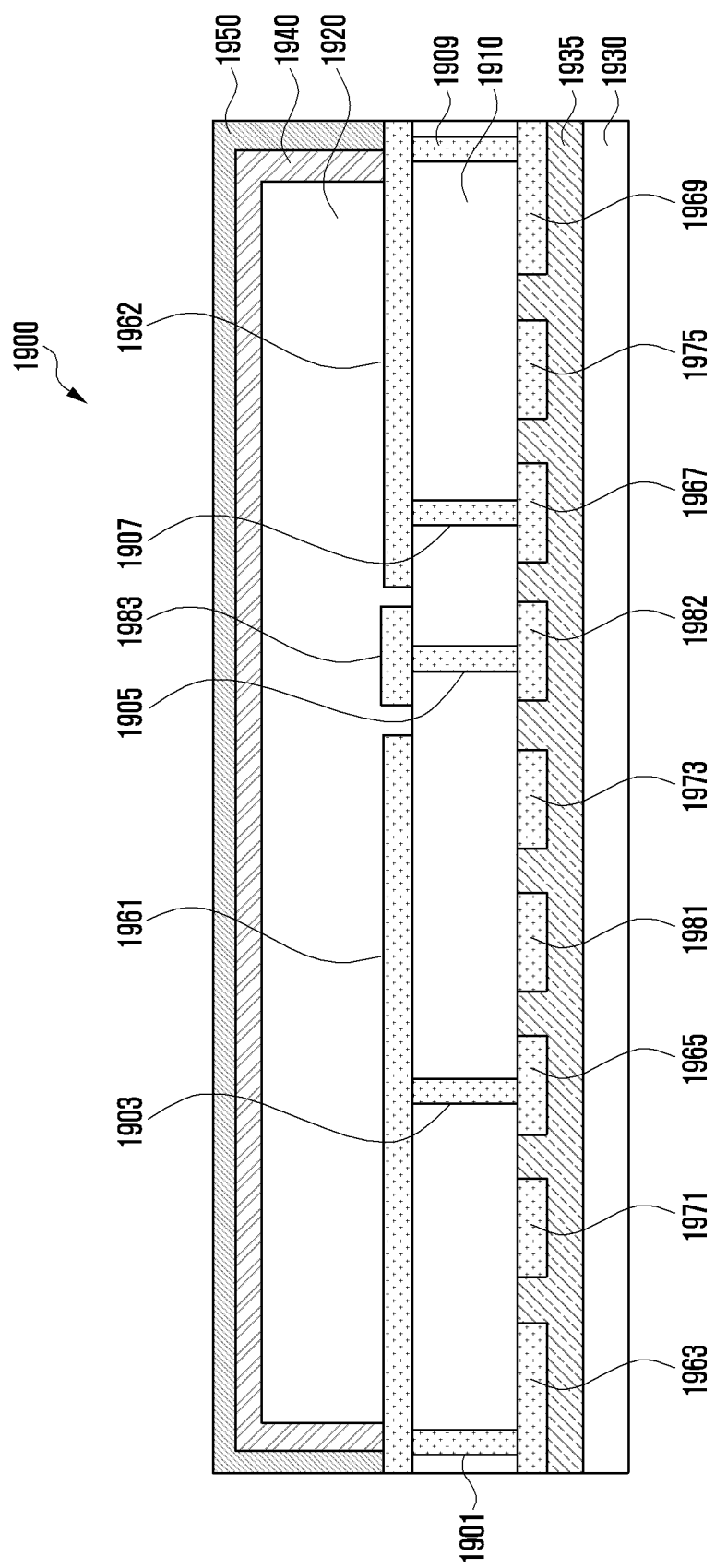
FIG. 19 is a cross-sectional view illustrating an example configuration of a flexible flat cable according to an example embodiment of the disclosure.

FIG. 19 is a cross-sectional view illustrating an example configuration of a flexible flat cable according to an example embodiment of the disclosure.

In a description of FIG. 19, a description of the same configuration and function as those of the example embodiment of FIG. 18 may not be repeated. In the example embodiment of FIG. 19, a description of the same configuration and functions as those of other embodiments may not be repeated.

With reference to FIG. 19, a flexible flat cable 1900 according to the example embodiment of FIG. 19 of the disclosure may include a first insulating portion 1910, second insulating portion 1920, third insulating portion 1930, non-conductive adhesive layer 1935, conductive adhesive layer 1940, shielding portion 1950, first ground portion 1961, second ground portion 1962, 3-1 ground portion 1963, 3-2 ground portion 1965, 3-3 ground portion 1967, 3-4 ground portion 1969, first via 1901 to fifth via 1909 (e.g., 1901, 1903, 1905, 1907, 1909), first signal transmission line 1971, second signal transmission line 1973, third signal transmission line 1975, first power line 1981, second power line 1982, and third power line 1983.

According to an embodiment, the first ground portion 1961, the third power line 1983, and the second ground portion 1962 may be disposed at predetermined intervals on the first insulation portion 1910.

According to an embodiment, the second insulation portion 1920 may be disposed over the first insulation portion 1910. The second insulation portion 1920 may enclose and insulate the first ground portion 1961, the third power line 1983, and the second ground portion 1962 disposed at predetermined intervals on the first insulation portion 1910.

According to an example embodiment, the conductive adhesive layer 1940 may enclose the second insulating portion 1920. The first end (e.g., the left end) of the conductive adhesive layer 1940 may be electrically connected to the first ground portion 1961. The second end (e.g., the right end) of the conductive adhesive layer 1940 may be electrically connected to the second ground portion 1962.

According to an embodiment, the shielding portion 1950 may be adhered to the outside of the conductive adhesive layer 1940 to perform a shielding function. The first end (e.g., the left end) of the shielding portion 1950 may be electrically connected to the first ground portion 1961. The second end (e.g., right end) of the shielding portion 1950 may be electrically connected to the second ground portion 1962.

According to an embodiment, the 3-1 ground portion 1963, the first signal transmission line 1971, the 3-2 ground portion 1965, the first power line 1981, the second signal transmission line 1973, the second power line 1982, the 3-3 ground portion 1967, the third signal transmission line 1975, and the 3-4 ground portion 1969 may be disposed at predetermined intervals beneath the first insulation portion 1910.

According to an example embodiment, the non-conductive adhesive layer 1935 may enclose the 3-1 ground portion 1963, the first signal transmission line 1971, the 3-2 ground portion 1965, the first power line 1981, the second signal transmission line 1973, the second power line 1982, the 3-3 ground portion 1967, the third signal transmission line 1975, and the 3-4 ground portion 1969 disposed at predetermined intervals. The third insulating portion 1930 may be disposed beneath the non-conductive adhesive layer 1935.

According to an embodiment, by penetrating the first insulating portion 1910, a first via 1901 may electrically connect the first ground portion 1961 and the 3-1 ground portion 1963. By penetrating the first insulating portion 1910, a second via 1903 may electrically connect the first ground portion 1961 and the 3-2 ground portion 1965. By penetrating the first insulation portion 1910, a third via 1905 may electrically connect the second power line 1982 and the third power line 1983. By penetrating the first insulating portion 1910, a fourth via 1907 may electrically connect the second ground portion 1962 and the 3-3 ground portion 1967. By penetrating the first insulating portion 1910, a fifth via 1909 may electrically connect the second ground portion 1962 and the 3-4 ground portion 1969.

Figure 20:
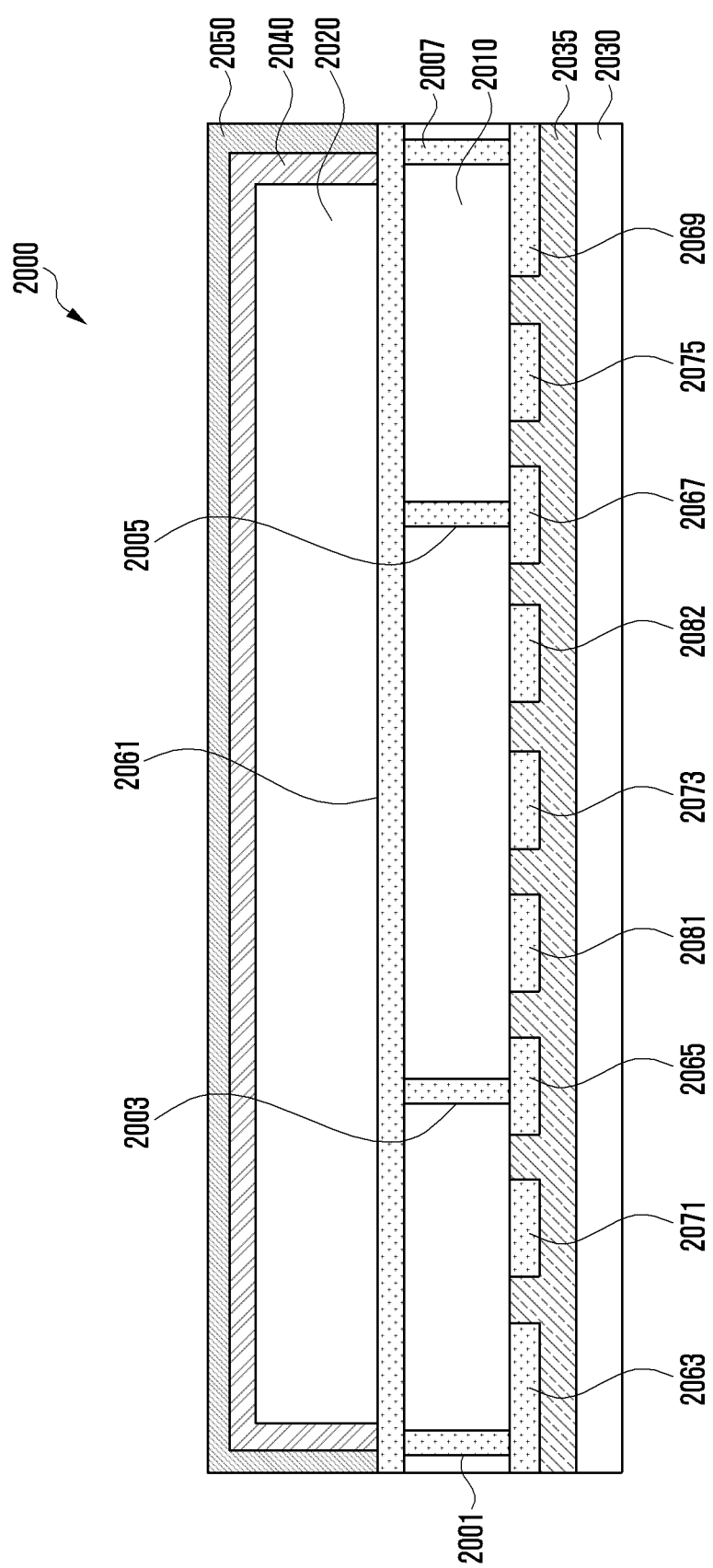
FIG. 20 is a cross-sectional view illustrating an example configuration of a flexible flat cable according to an example embodiment of the disclosure.

FIG. 20 is a cross-sectional view illustrating an example configuration of a flexible flat cable according to an example embodiment of the disclosure.

In a description of FIG. 20, a description of the same configuration and functions as those of the example embodiment of FIG. 19 may not be repeated. In the example embodiment of FIG. 20, a description of the same configuration and functions as those of other embodiments may not be repeated.

With reference to FIG. 20, a flexible flat cable 2000 according to the example embodiment of FIG. 20 of the disclosure may include a first insulation portion 2010, second insulation portion 2020, third insulation portion 2030, non-conductive adhesive layer 2035, conductive adhesive layer 2040, shielding portion 2050, first ground portion 2061, 2-1 ground portion 2063, 2-2 ground portion 2065, 2-3 ground portion 2067, 2-4 ground portion 2069, first via 2001 to fourth via 2007 (e.g., 2001, 2003, 2005, 2007), first signal transmission line 2071, second signal transmission line 2073, third signal transmission line 2075, first power line 2081, and second power line 2082.

According to an embodiment, the first ground portion 2061 may be disposed on the first insulation portion 2010.

According to an embodiment, the second insulation portion 2020 may be disposed over the first insulation portion 2010. The second insulation portion 2020 may enclose the first ground portion 2061.

According to an example embodiment, the conductive adhesive layer 2040 may enclose the second insulating portion 2020. The first end (e.g., the left end) of the conductive adhesive layer 2040 may be electrically connected to the first ground portion 2061. The second end (e.g., the right end) of the conductive adhesive layer 2040 may be electrically connected to the first ground portion 2061.

According to an example embodiment, the shielding portion 2050 may be adhered to the outside of the conductive adhesive layer 2040 to perform a shielding function. The first end (e.g., the left end) of the shielding portion 2050 may be electrically connected to the first ground portion 2061. The second end (e.g., the right end) of the shielding portion 2050 may be electrically connected to the first ground portion 2061.

According to an example embodiment, the 2-1 ground portion 2063, the first signal transmission line 2071, the 2-2 ground portion 2065, the first power line 2081, the second signal transmission line 2073, the second power line 2082, the 2-3 ground portion 2067, the third signal transmission line 2075, and the 2-4 ground portion 2069 may be disposed at predetermined intervals beneath the first insulating portion 2010.

According to an example embodiment, the non-conductive adhesive layer 2035 may enclose the 2-1 ground portion 2063, the first signal transmission line 2071, the 2-2 ground portion 2065, the first power line 2081, the second signal transmission line 2073, the second power line 2082, the 2-3 ground portion 2067, the third signal transmission line 2075, and the 2-4 ground portion 2069 disposed at predetermined intervals. The third insulating portion 2030 may be disposed beneath the non-conductive adhesive layer 2035.

According to an embodiment, by penetrating the first insulation portion 2010, a first via 2001 may electrically connect the first ground portion 2061 and the 2-1 ground portion 2063. By penetrating the first insulation portion 2010, a second via 2003 may electrically connect the first ground portion 2061 and the 2-2 ground portion 2065. By penetrating the first insulation portion 2010, a third via 2005 may electrically connect the first ground portion 2061 and the 2-3 ground portion 2067. By penetrating the first insulation portion 2010, a fourth via 2007 may electrically connect the first ground portion 2061 and the 2-4 ground portion 2069.

Figure 21:
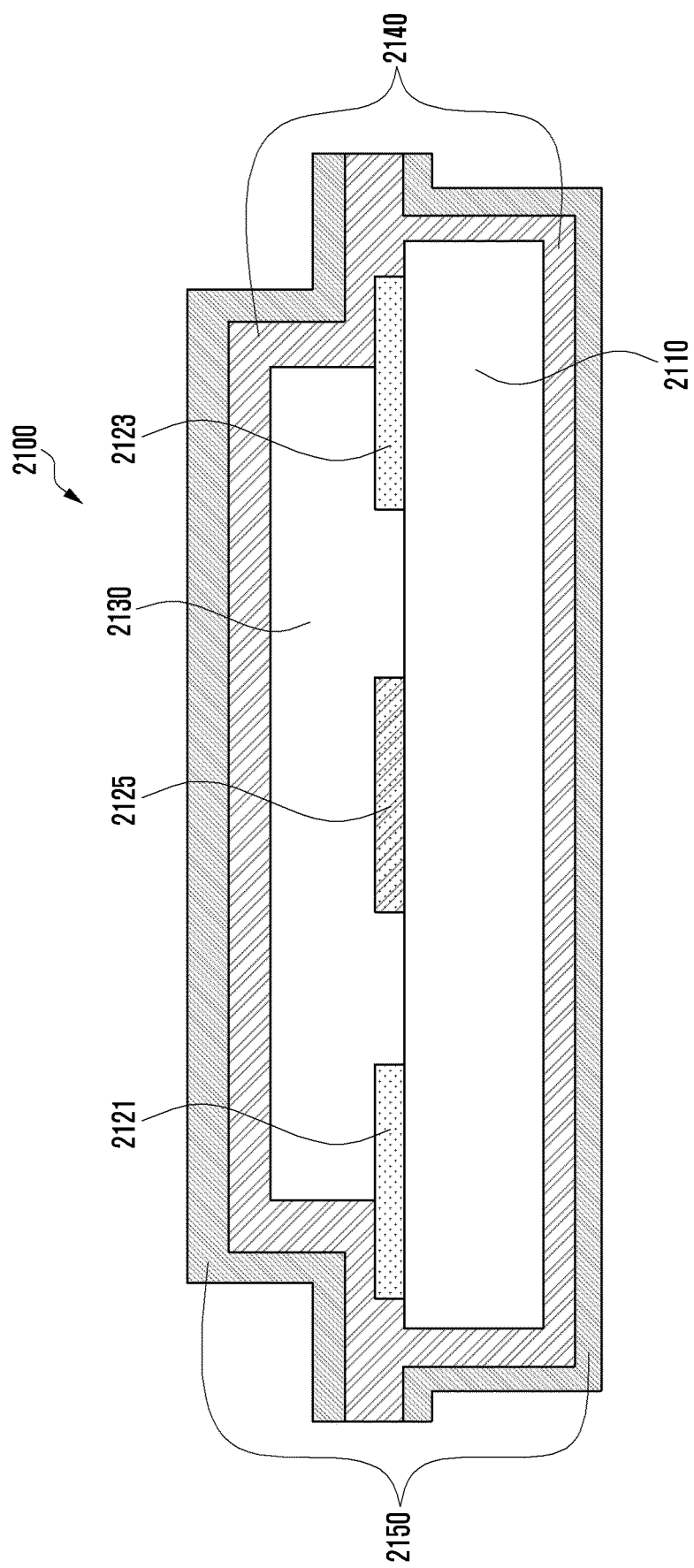
FIG. 21 is a cross-sectional view illustrating an example configuration of a flexible flat cable according to an example embodiment of the disclosure.

FIG. 21 is a cross-sectional view illustrating an example configuration of a flexible flat cable according to an example embodiment of the disclosure.

In a description of FIG. 21, a description of the same configuration and functions as those of the example embodiment of FIG. 1 to the example embodiment of FIG. 20 may not be repeated.

With reference to FIG. 21, a flexible flat cable 2100 according to the example embodiment of FIG. 21 of the disclosure may include a first insulation portion 2110, first ground portion 2121, signal transmission line 2125, second ground portion 2123, second insulating portion 2130, conductive adhesive layer 2140, and shielding portion 2150.

According to an embodiment, the first insulating portion 2110 and the second insulating portion 2130 may be made of a material having an insulating property.

According to an embodiment, the first ground portion 2121, the signal transmission line 2125, and the second ground portion 2123 may be disposed at predetermined intervals on the first insulation portion 2110.

According to an embodiment, the signal transmission line 2125 may be disposed between the first ground portion 2121 and the second ground portion 2123. At least one power line (not illustrated) may be disposed between the first ground portion 2121 and the second ground portion 2123.

According to an embodiment, the second insulation portion 2130 may be disposed on at least a portion of the first ground portion 2121 and at least a portion of the signal transmission line 2125 and the second ground portion 2123.

According to an embodiment, the conductive adhesive layer 2140 may enclose the first insulating portion 2110 and the second insulating portion 2130. The conductive adhesive layer 2140 may be electrically connected to the first ground portion 2121 and the second ground portion 2123.

According to an embodiment, the shielding portion 2150 may be adhered to the outside of the conductive adhesive layer 2140 to perform a shielding function.

FIGS. 22A, 22B, 22C, 22D, 22E and 22F are diagrams illustrating an example production process of the flexible flat cable of FIG. 21 according to an example embodiment of the disclosure.

In FIG. 22, FIG. 21 is used as an example, but a production process of FIG. 22 may be applied substantially equally to the example embodiment of FIG. 1 to the example embodiment of FIG. 20.

Figure 22A:
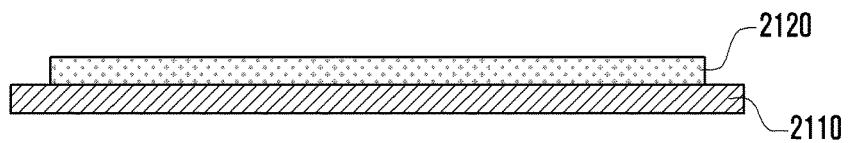
FIGS. 22A, 22B, 22C, 22D, 22E and 22F are diagrams illustrating an example production process of the flexible flat cable of FIG. 21 according to an example embodiment.

With reference to FIG. 22A, a copper thin film layer 2120 may be prepared on a first insulating portion 2110.

Figure 22B:
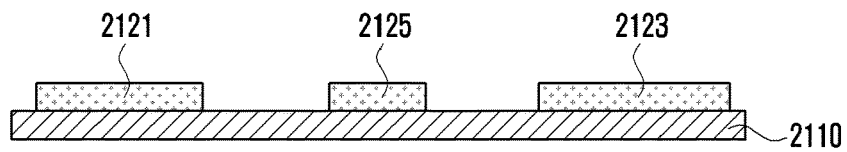

With reference to FIG. 22B, at least a portion of the copper thin film layer 2120 may be etched to form a first ground portion 2121, a signal transmission line 2125, and a second ground portion 2123.

Figure 22C:
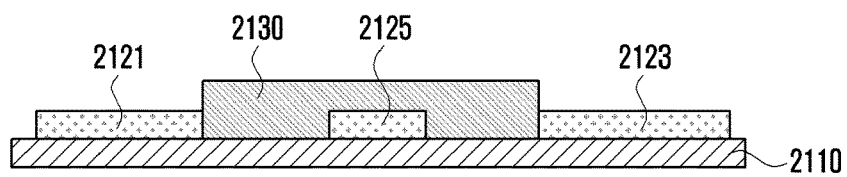

With reference to FIG. 22C, a second insulation portion 2130 may have a predetermined groove to cover the signal transmission line 2125. A portion of the second insulation portion 2130 corresponding to the first ground portion 2121 and the second ground portion 2123 may be punched. The second insulation portion 2130 may be removed while maintaining only a portion enclosing the signal transmission line 2125. The second insulation portion 2130 may be stacked on the first insulation portion 2110. Thereby, the first ground portion 2121 and the second ground portion 2123 may be exposed to the outside. The signal transmission line 2125 may be received in the first insulation portion 2110 and the second insulation portion 2130.

Figure 22D:
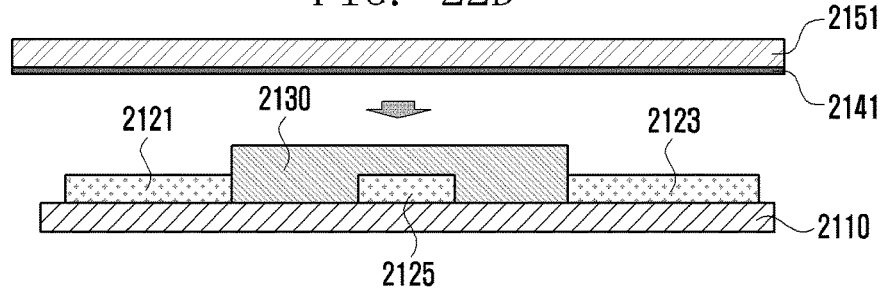

With reference to FIG. 22D, a first conductive adhesive layer 2141 adhered to a lower surface of a first shielding portion 2151 may be stacked and pressed at both side ends of the first insulating portion 2110 and an upper portion of the first ground portion 2121, the second insulation portion 2130, and the second ground portion 2123. In this case, the first conductive adhesive layer 2141 and the first shielding portion 2151 may be deformed according to a shape formed by the first ground portion 2121, the second insulation portion 2130, and the second ground portion 2123.

According to an embodiment, the first conductive adhesive layer 2141 may be electrically connected to the first ground portion 2121 and the second ground portion 2123.

Figure 22E:
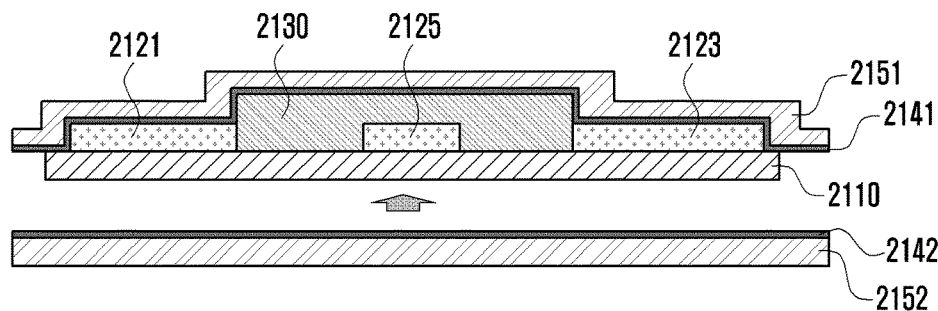

With reference to FIG. 22E, a second conductive adhesive layer 2142 adhered to an upper surface of a second shielding portion 2152 may be stacked and pressed beneath the first insulating portion 2110.

According to an embodiment, both side ends of the second conductive adhesive layer 2142 may be connected to both side ends of the first conductive adhesive layer 2141.

According to an embodiment, the first conductive adhesive layer 2141 and the second conductive adhesive layer 2142 may form the conductive adhesive layer 2140 of FIG. 21. The first shielding portion 2151 and the second shielding portion 2152 may form the conductive adhesive layer 2140 of FIG. 21.

Figure 22F:
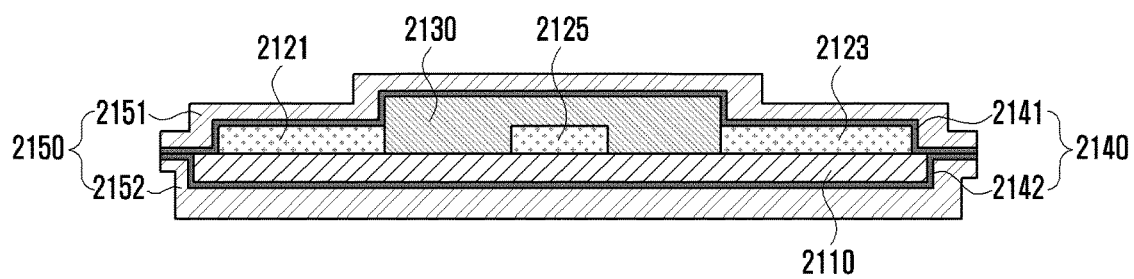

With reference to FIG. 22F, the flexible flat cable 2100 of FIG. 21 may be produced through the above-described processes of FIGS. 22A to 22E.

According to an embodiment, because the signal transmission line 2125 is enclosed by the first ground line 2121, the second ground line 2122, and the conductive adhesive layer 2140, the signal transmission line 2125 may be shielded from noise transferred from the outside.

Figure 23:
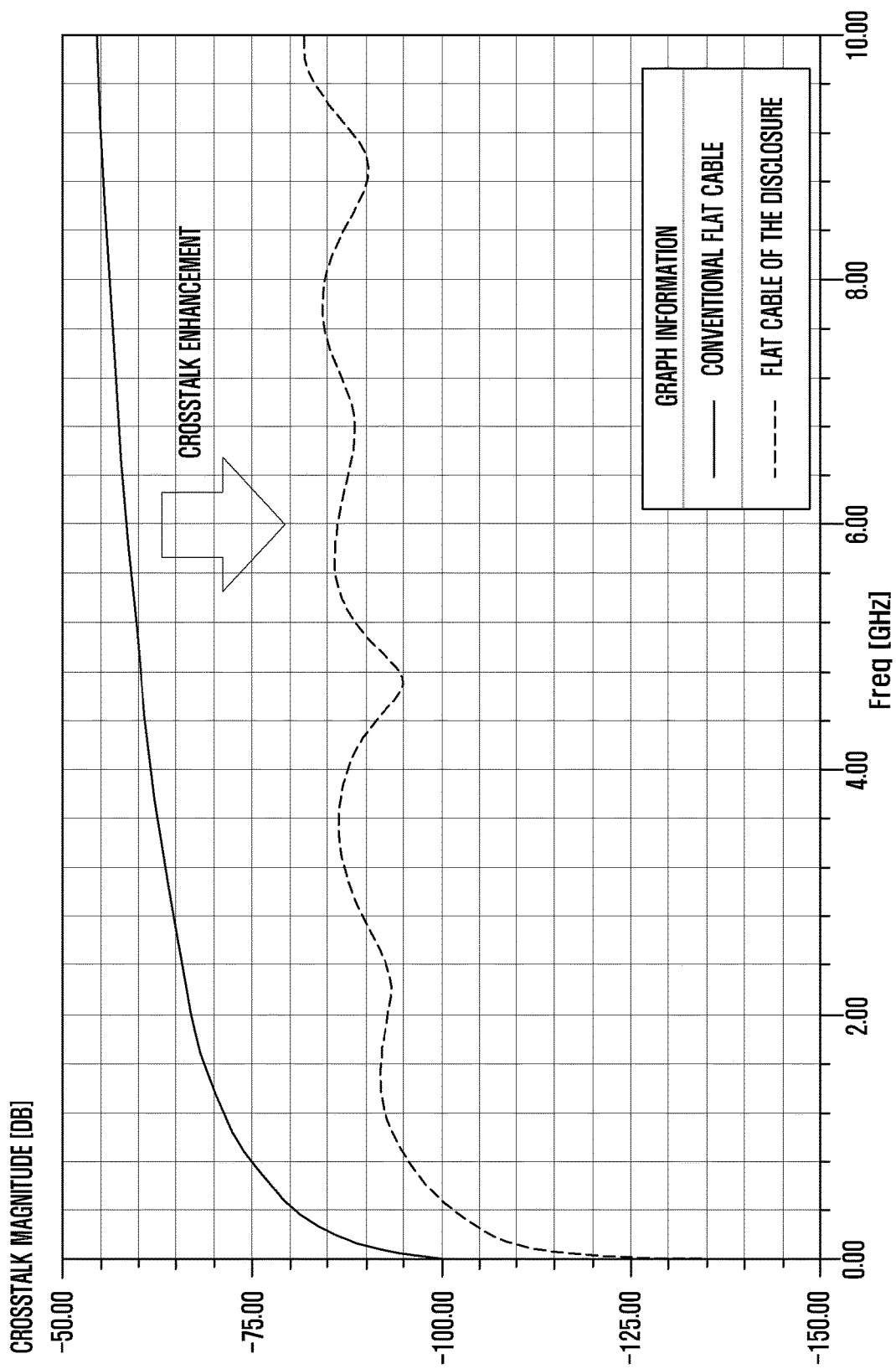
FIG. 23 is a graph comparing signal crosstalk characteristics of a conventional flexible flat cable and a flexible flat cable according to various example embodiments of the disclosure.

FIG. 23 is a graph comparing signal crosstalk characteristics of a conventional flexible flat cable and a flexible flat cable according to various example embodiments of the disclosure.

With reference to FIG. 23, a magnitude of crosstalk of a conventional flexible flat cable is represented by a solid line, and a magnitude of crosstalk in which a flexible flat cable has according to various embodiments of the disclosure according to a frequency is represented by a dotted line.

As illustrated in FIG. 23, it may be determined that a magnitude of crosstalk of the flexible flat cable according to various embodiments of the disclosure was improved, compared with the conventional flexible flat cable.

For example, a magnitude of crosstalk of the flexible flat cable according to various embodiments of the disclosure may be improved by about 31.22 dB at a frequency of 5 GHz, compared with a conventional flexible flat cable.

Figure 24:
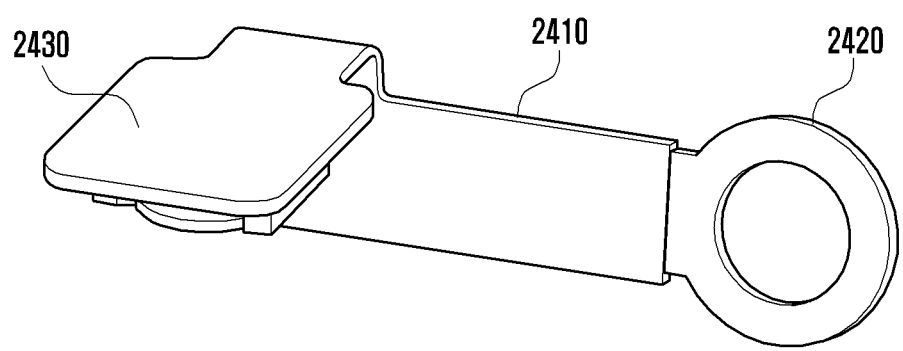
FIG. 24 is a diagram illustrating an example of a flexible flat cable according to various example embodiments of the disclosure.

FIG. 24 is a diagram illustrating an example flexible flat cable according to various example embodiments of the disclosure.

With reference to FIG. 24, in a flexible flat cable 2410 according to various embodiments of the disclosure, a screw fastening portion 2420 may be connected to the first end thereof, and a connector 2430 may be connected to the second end thereof.

According to an embodiment, the flexible flat cable 2410 may be integrally formed with the connector 2430. In the screw fastening portion 2420, the first end of the flexible flat cable 2410 and a leg portion of the screw fastening portion 2420 may be connected by bonding. The flexible flat cable 2410 may use various plating methods (e.g., gold plating, silver plating, or nickel plating) in order to prevent corrosion and improve grounding.

Figure 25:
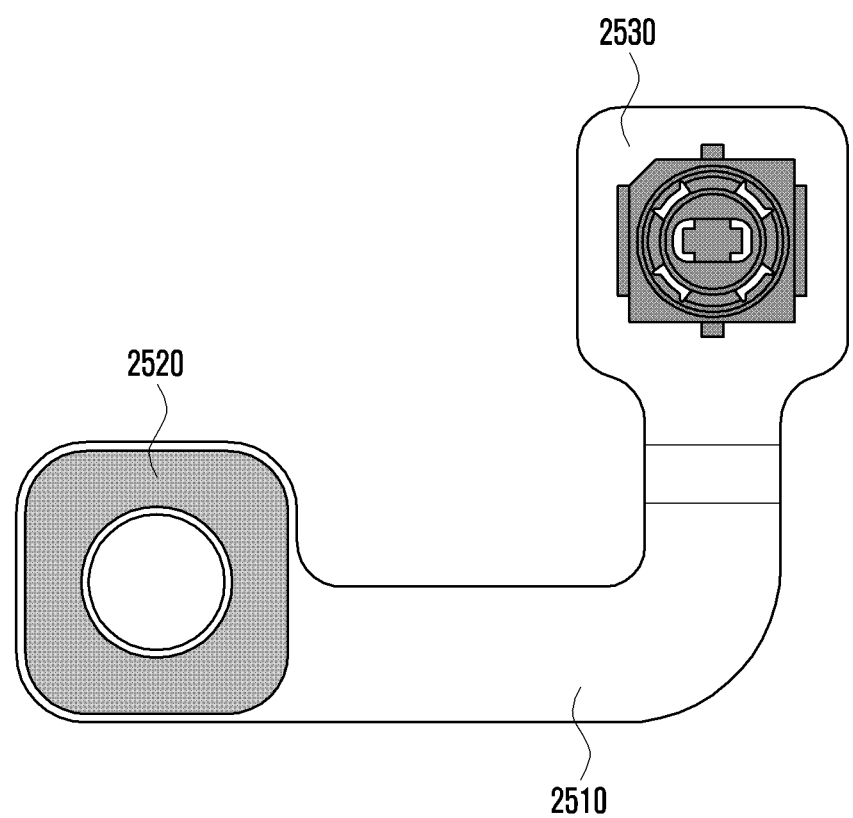
FIG. 25 is a diagram illustrating another example of a flexible flat cable according to various embodiments of the disclosure.

FIG. 25 is a diagram illustrating another example flexible flat cable according to various example embodiments of the disclosure.

With reference to FIG. 25, in a flexible flat cable 2510 according to various embodiments of the disclosure, a screw fastening portion 2520 may be connected to the first end thereof, and a connector 2530 may be connected to the second end thereof.

According to an example embodiment, the screw fastening portion 2520 may be adhered on the first end of the flexible flat cable 2510. Holes may be formed in the screw fastening portion 2520 and the flexible flat cable 2510.

Figure 26:
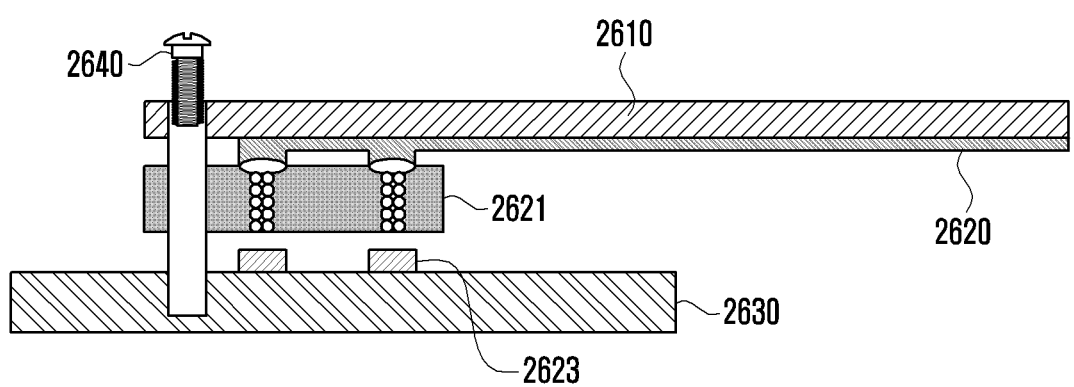
FIG. 26 is a diagram illustrating another example of a flexible flat cable according to various example embodiments of the disclosure.

FIG. 26 is a diagram illustrating another example flexible flat cable according to various example embodiments of the disclosure.

With reference to FIG. 26, a flexible flat cable 2610 according to various embodiments of the disclosure may be connected to an elastomer connector 2621.

According to an embodiment, a copper layer 2620 may be disposed beneath the flexible flat cable 2610. The elastomeric connector 2621 may be disposed beneath the copper layer 2620. The copper layer 2620 and the elastomeric connector 2621 may be connected through a bonding pad. The elastomeric connector 2621 may be connected to a printed circuit board (PCB) 2630 through a contact point 2623. The flexible flat cable 2610, the elastomer connector 2621, and the PCB 2630 may be fixed through a pressing screw 2640. According to an embodiment, a ground portion may be formed at a portion, except for a signal transmission structure of the elastomeric connector 2621, to help shielding characteristics of the flexible flat cable and the elastomeric connector 2621.

According to various embodiments of the disclosure, it is possible to provide a flexible flat cable and a method of producing the same that can simultaneously transmit a plurality of signals while having good electromagnetic interference and crosstalk characteristics by improving shielding efficiency of a plurality of signal transmission lines.

While the disclosure has been illustrated and described with reference to various example embodiments thereof, it will be understood by those skilled in the art that various changes in form and details may be made therein without departing from the scope of the disclosure including the appended claims.

What is claimed is:

1. A flexible flat cable, comprising:
a plate-shaped first insulation portion comprising an insulating material;
a first ground, a second ground, and a third ground disposed at predetermined intervals on a first surface of the first insulation portion;
at least one first signal transmission line positioned between the first ground and the second ground and disposed on the first surface of the first insulation portion;
at least one second signal transmission line positioned between the second ground and the third ground and disposed on the first surface of the first insulation portion;
a first second insulation portion comprising an insulating material disposed on at least a portion of a top surface of the first ground, at least a portion of a top surface of the first signal transmission line, at least a portion of a top surface of the second ground and at least a portion of the first surface of the first insulation portion;
a second insulation portion comprising an insulating material disposed on at least a portion of the top surface of the second ground, at least a portion of a top surface of the second signal transmission line, at least a portion of a top surface of the third ground and at least a portion of the first surface of the first insulation portion, wherein the second insulation portion is separated from the first second insulation portion by the second ground and the top surfaces of the first ground, the second ground, the third ground, the first signal transmission line and the second signal transmission line face a same direction;
a conductive adhesive layer configured to enclose the first insulation portion, the first second insulation portion, and the second insulation portion; and
a shielding portion comprising a shielding material adhered to the outside of the conductive adhesive layer.

2. The flexible flat cable of claim 1, wherein the at least one first signal transmission line and the at least one second signal transmission line are configured to transmit differential signals having different phases.

3. The flexible flat cable of claim 1, wherein the conductive adhesive layer is electrically connected to the first ground, the second ground, and the third ground.

4. The flexible flat cable of claim 1, further comprising a first mesh copper layer disposed between a lower surface of the first insulation portion and the conductive adhesive layer.

5. The flexible flat cable of claim 1, further comprising a bonding sheet disposed between a lower surface of the first insulation portion and the conductive adhesive layer.

6. The flexible flat cable of claim 1, further comprising a bonding sheet and a first mesh copper layer disposed between a lower surface of the first insulation portion and the conductive adhesive layer.

7. The flexible flat cable of claim 6, further comprising:
a first via configured to penetrate the first insulation portion and the bonding sheet to electrically connect the first ground and the first mesh copper layer;
a second via configured to penetrate the first insulation portion and the bonding sheet to electrically connect a first end of the second ground and the first mesh copper layer;
a third via configured to penetrate the first insulation portion and the bonding sheet to electrically connect a second end of the second ground and the first mesh copper layer; and
a fourth via configured to penetrate the first insulation portion and the bonding sheet to electrically connect the third ground and the first mesh copper layer.

8. The flexible flat cable of claim 1, wherein the adhesive layer configured to enclose a portion of the first ground and a portion of the first insulation portion and a portion of the third ground comprises a non-conductive adhesive layer.

9. The flexible flat cable of claim 8, wherein the shielding portion comprises a third insulation portion enclosing the non-conductive adhesive layer.

10. The flexible flat cable of claim 1, wherein a second mesh copper layer is disposed on the first second insulation portion and the second insulation portion.

11. The flexible flat cable of claim 10, wherein the adhesive layer configured to enclose an upper surface of the second mesh copper layer, both side ends of the second mesh copper layer, and side surfaces of the first second insulation portion and the second insulation portion comprises a non-conductive adhesive layer.

12. The flexible flat cable of claim 11, wherein the shielding portion comprises a fourth insulation portion enclosing the non-conductive adhesive layer.

13. The flexible flat cable of claim 11, further comprising:
a fifth via configured to penetrate the first second insulation portion to electrically connect the first ground and the second mesh copper layer;
a sixth via configured to penetrate the first second insulation portion to electrically connect a first end of the second ground and the second mesh copper layer;
a seventh via configured to penetrate the second insulation portion to electrically connect a second end of the second ground and the second mesh copper layer; and
an eighth via configured to penetrate the second insulation portion to electrically connect the third ground and the second mesh copper layer.

14. The flexible flat cable of claim 1, wherein the conductive adhesive layer is electrically connected to at least a portion of the top surface of the first ground, the top surface of the second ground, and the top surface of the third ground.

15. A flexible flat cable, comprising:
a plate-shaped first insulation portion comprising an insulating material;
a first ground, a second ground, and a third ground disposed at predetermined intervals on a first surface of the first insulation portion;
a first power line and a first signal transmission line positioned between the first ground and the second ground and disposed on the first surface of the first insulation portion;
a second signal transmission line positioned between the second ground and the third ground and disposed on the first surface of the first insulation portion;
a first second insulation portion comprising an insulating material disposed on at least a portion of a top surface of the first ground, at least a portion of a top surface of the first power line, at least a portion of a top surface of the first signal transmission line, at least a portion of a top surface of the second ground, and at least a portion of the first surface of the first insulation portion;
a second insulation portion comprising an insulating material disposed on at least a portion of the top surface of the second ground, at least a portion of a top surface of the second signal transmission line, at least a portion of a top surface of the third ground and at least a portion of the first surface of the first insulation portion, wherein the second insulation portion is separated from the first second insulation portion by the second ground and the top surfaces of the first ground, the second ground, the third ground, the first power line, the first signal transmission line and the second signal transmission line face a same direction;
a conductive adhesive layer configured to enclose a portion of the first ground and the first second insulation portion, a portion of the second ground, and a portion of the first second insulation portion and the third ground;
a shielding portion comprising a shielding material adhered to the outside of the conductive adhesive layer;
a bonding sheet disposed at a lower surface of the first insulation portion;
a first mesh copper layer partially overlapping a lower surface of the bonding sheet;
a non-conductive adhesive layer configured to enclose side surfaces of the first ground and the third ground, a side surface of the first insulation portion, and the first mesh copper layer; and
a third insulation portion comprising an insulating material adhered to the outside of the non-conductive adhesive layer.

16. The flexible flat cable of claim 15, wherein a fourth ground, a third signal transmission line, and a second power line are disposed in an area in which the first mesh copper layer does not overlap the lower surface of the bonding sheet.

17. The flexible flat cable of claim 16, further comprising:
a first via configured to penetrate the first insulation portion and the bonding sheet to electrically connect the first ground and the fourth ground;
a second via configured to penetrate the first insulation portion and the bonding sheet to electrically connect a first end of the second ground and the first mesh copper layer;
a third via configured to penetrate the first insulation portion and the bonding sheet to electrically connect a second end of the second ground and the first mesh copper layer; and
a fourth via configured to penetrate the first insulation portion and the bonding sheet to electrically connect the third ground and the first mesh copper layer.

18. A method of making a flexible flat cable, the method comprising:
preparing a copper thin film layer on a plate-shaped first insulation portion;
etching at least a portion of the copper thin film layer to form, on a first surface of the first insulation portion, a first ground, a second ground, a third ground, a first signal transmission line between the first ground and the second ground, and a second transmission line between the second ground and the third ground;

punching a portion corresponding to the first ground, the second ground and the third ground;

stacking a first second insulation portion comprising an insulating material to enclose the first signal transmission line and to be provided on at least a portion of a top surface of the first ground, at least a portion of a top surface of the second ground and at least a portion of the first surface of the first insulation portion;

stacking a second insulation portion comprising an insulating material to enclose the second signal transmission line and to be provided on at least a portion of a top surface of the second ground, at least a portion of a top surface of the third ground and at least a portion of the first surface of the first insulation portion, wherein the second insulation portion is separated from the first second insulation portion by the second ground and the top surfaces of the first ground, the second ground, and the third ground face a same direction;

stacking and pressing a first conductive adhesive layer adhered to a lower surface of a first shielding portion on the first ground, the second ground, the first second insulation portion, the second insulation portion, and the third ground; and stacking and pressing a second conductive adhesive layer adhered to an upper surface of a second shielding portion beneath the first insulation portion to connect both side ends of the second conductive adhesive layer to both side ends of the first conductive adhesive layer.

* * * * *